United States Patent
Noh et al.

(10) Patent No.: US 11,508,733 B2
(45) Date of Patent: Nov. 22, 2022

(54) INTEGRATED CIRCUIT DEVICE WITH ION DOPED REGIONS THAT PROVIDE DOPANT IONS TO GATE DIELECTRIC FILM

(71) Applicant: SAMSUNG ELECTRONICS CO., LTD., Suwon-si (KR)

(72) Inventors: Hyungjun Noh, Suwon-si (KR); Junsoo Kim, Suwon-si (KR); Dongsoo Woo, Suwon-si (KR); Namho Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 125 days.

(21) Appl. No.: 16/744,871

(22) Filed: Jan. 16, 2020

(65) Prior Publication Data

US 2020/0381436 A1    Dec. 3, 2020

(30) Foreign Application Priority Data

May 29, 2019    (KR) .......................... 10-2019-0063311

(51) Int. Cl.
H01L 25/065    (2006.01)
H01L 25/00    (2006.01)
(Continued)

(52) U.S. Cl.
CPC .. H01L 27/10823 (2013.01); H01L 21/26513 (2013.01); H01L 21/31155 (2013.01);
(Continued)

(58) Field of Classification Search
CPC ............. H01L 27/1052; H01L 27/1055; H01L 27/1057; H01L 27/10823; H01L 29/1037; H01L 27/11582; H01L 27/1157
See application file for complete search history.

(56) References Cited

U.S. PATENT DOCUMENTS 4,889,492 A * 12/1989 Barden ............. H01L 27/10829
257/E21.396
5,372,951 A * 12/1994 Anjum ............. H01L 21/26506
438/440
(Continued)

FOREIGN PATENT DOCUMENTS

KR    10-2009-0039203    4/2009
KR      10-1213723    12/2012
KR    10-2014-0028907    3/2014

OTHER PUBLICATIONS

Ion Implantation, MA Schmidt, MIT lecture 8, 2003 (Year: 2003).*
Thermally Oxidized Silicon, Anneli Munkholm, SSRL Science Highlight, Jul. 2004 (Year: 2004).*

*Primary Examiner* — Brigitte A Paterson
*Assistant Examiner* — Tenley H Schofield
(74) *Attorney, Agent, or Firm* — F. Chau & Associates, LLC

(57) ABSTRACT

An integrated circuit device includes: a substrate including active regions; a device isolation film defining the active regions; a word line arranged over the active regions and the device isolation film and extending in a first horizontal direction; and a gate dielectric film arranged between the substrate and the word line and between the device isolation film and the word line, in which, in a second horizontal direction orthogonal to the first horizontal direction, a width of a second portion of the word line over the device isolation film is greater than a width of a first portion of the word line over the active regions. To manufacture the integrated circuit device, an impurity region is formed in the substrate and the device isolation film by implanting dopant ions into the substrate and the device isolation film, and a thickness of a portion of the impurity region is reduced.

17 Claims, 24 Drawing Sheets

(51) Int. Cl.
  *H01L 21/768*  (2006.01)
  *H01L 23/00*  (2006.01)
  *H01L 23/31*  (2006.01)
  *H01L 27/108*  (2006.01)
  *H01L 29/66*  (2006.01)
  *H01L 21/285*  (2006.01)
  *H01L 21/311*  (2006.01)
  *H01L 21/3213*  (2006.01)
  *H01L 23/528*  (2006.01)
  *H01L 29/51*  (2006.01)
  *H01L 21/3115*  (2006.01)
  *H01L 21/265*  (2006.01)
  *H01L 21/28*  (2006.01)
  *H01L 21/02*  (2006.01)
  *H01L 21/3065*  (2006.01)

(52) U.S. Cl.
  CPC ...... *H01L 23/528* (2013.01); *H01L 27/10876* (2013.01); *H01L 27/10891* (2013.01); *H01L 29/51* (2013.01); *H01L 21/0206* (2013.01); *H01L 21/0228* (2013.01); *H01L 21/02274* (2013.01); *H01L 21/2822* (2013.01); *H01L 21/3065* (2013.01)

(56) References Cited

U.S. PATENT DOCUMENTS

| | | | |
|---|---|---|---|
| 5,930,658 A * | 7/1999 | Ibok | H01L 21/02255 |
| | | | 438/482 |
| 6,040,211 A * | 3/2000 | Schrems | H01L 29/66181 |
| | | | 438/238 |
| 8,088,662 B2 | 1/2012 | Yeh | |
| 8,691,649 B2 | 4/2014 | Park et al. | |
| 8,729,675 B1 * | 5/2014 | Choi | H01L 27/10885 |
| | | | 257/621 |
| 10,211,086 B2 * | 2/2019 | Nagai | H01L 21/761 |
| 2004/0053458 A1 * | 3/2004 | Kuroi | H01L 21/823481 |
| | | | 257/E21.546 |
| 2012/0211813 A1 * | 8/2012 | Taketani | H01L 29/0653 |
| | | | 257/296 |
| 2013/0228892 A1 * | 9/2013 | Arai | H01L 27/10873 |
| | | | 257/499 |
| 2015/0035061 A1 | 2/2015 | Yoon et al. | |
| 2016/0087035 A1 * | 3/2016 | Kim | H01L 27/10805 |
| | | | 257/368 |
| 2016/0204201 A1 * | 7/2016 | Oh | H01L 27/10814 |
| | | | 257/330 |
| 2016/0351711 A1 * | 12/2016 | Bae | H01L 29/4236 |
| 2019/0097596 A1 | 3/2019 | Akiyama et al. | |
| 2020/0303240 A1 * | 9/2020 | Chang | H01L 21/76224 |

* cited by examiner ized circuit device, and more particularly, to an integrated circuit device having a buried word line and a method of manufacturing the integrated circuit device.

INTEGRATED CIRCUIT DEVICE WITH ION DOPED REGIONS THAT PROVIDE DOPANT IONS TO GATE DIELECTRIC FILM

CROSS-REFERENCE TO RELATED APPLICATION

This application claims the benefit under 35 U.S.C. § 119 of Korean Patent Application No. 10-2019-0063311, filed on May 29, 2019, in the Korean Intellectual Property Office, the disclosure of which is incorporated by reference herein in its entirety.

TECHNICAL FIELD

The present inventive concept relates to an integrated circuit device and a method of manufacturing the integrated circuit device, and more particularly, to an integrated circuit device having a buried word line and a method of manufacturing the integrated circuit device.

DISCUSSION OF RELATED ART

As the degrees of integration of integrated circuit devices increase, issues due to an increase in resistance of a plurality of word lines and due to a reduction in pitch of the plurality of word lines may exert adverse effects on refresh characteristics of the integrated circuit devices. Recently, buried word line transistors have been used to increase the effective channel length, suppress the subthreshold leakage, and increase the degrees of integration of the integrated circuit devices. To take care of an interface dangling bond and an oxygen vacancy (Vo) in a gate oxide of the buried word line transistor and to enhance the refresh characteristics of the integrated circuit device, hydrogen (H) passivation has been used. Since the Vo-H bond formed through the hydrogen (H) passivation process may be broken during the use of a final product by a user, a threshold voltage of a gate electrode of the buried word line transistor may be changed toward an unintended direction. Therefore, there is a need to develop a novel technique for precisely controlling the threshold voltage of the gate electrode and enhancing the reliability of the integrated circuit device.

SUMMARY

The present inventive concept provides an integrated circuit device having a structure capable of precisely controlling a threshold voltage of a gate electrode and exhibiting enhanced reliability.

The present inventive concept also provides a method of manufacturing an integrated circuit device, which has a structure capable of precisely controlling a threshold voltage of a gate electrode and exhibiting enhanced reliability.

According to an aspect of the present inventive concept, there is provided an integrated circuit device including: a substrate including a plurality of active regions spaced apart from each other; a device isolation film arranged on the substrate and surrounding the plurality of active regions; a word line arranged over the plurality of active regions and the device isolation film and extending lengthwise in a first horizontal direction; and a gate dielectric film arranged between the substrate and the word line and between the device isolation film and the word line, in which a width of a second portion of the word line is greater than a width of a first portion of the word line in a second horizontal direction that is orthogonal to the first horizontal direction, with the first portion being arranged over the plurality of active regions, and the second portion being arranged over the device isolation film.

According to another aspect of the present inventive concept, there is provided an integrated circuit device including: a substrate including a device isolation trench, which defines a plurality of active regions apart from each other; a device isolation film formed in the device isolation trench; a word line trench extending lengthwise in a first horizontal direction across the plurality of active regions and the device isolation film; a gate dielectric film covering an inner wall of the word line trench; and a word line arranged on the gate dielectric film and partially filling the word line trench, in which a width of a second portion of the word line is greater than a width of a first portion of the word line in a second horizontal direction that is orthogonal to the first horizontal direction, with the first portion being arranged over the plurality of active regions, and the second portion being arranged over the device isolation film.

According to yet another aspect of the present inventive concept, there is provided an integrated circuit device including: a substrate including a plurality of active regions spaced apart from each other; a device isolation film arranged on the substrate and surrounding the plurality of active regions; a word line arranged over the plurality of active regions and the device isolation film and extending lengthwise in a first horizontal direction; a gate dielectric film arranged between the substrate and the word line and between the device isolation film and the word line; and an impurity region arranged on the substrate and the device isolation film and contacting the gate dielectric film, in which a width of a second portion of the word line is greater than a width of a first portion of the word line in a second horizontal direction that is orthogonal to the first horizontal direction, with the first portion being arranged over the plurality of active regions, and the second portion being arranged over the device isolation film.

According to yet another aspect of the present inventive concept, there is provided a method of manufacturing an integrated circuit device, the method including: forming a device isolation trench by etching a substrate, the device isolation trench defining a plurality of active regions apart from each other; forming a device isolation film in the device isolation trench; forming a word line trench by partially removing both the plurality of active regions and the device isolation film, the word line trench extending lengthwise in a first horizontal direction across the plurality of active regions and the device isolation film; forming an impurity region in the substrate and the device isolation film by implanting dopant ions into the substrate and the device isolation film through the word line trench; reducing a thickness of a portion of the impurity region; forming a gate dielectric film in the word line trench, the gate dielectric film contacting the impurity region; and forming a word line on the gate dielectric film to partially fill the word line trench, the word line having a variable width in a second horizontal direction that is orthogonal to the first horizontal direction.

BRIEF DESCRIPTION OF THE DRAWINGS

Exemplary embodiments of the present inventive concept will be more clearly understood from the following detailed description taken in conjunction with the accompanying drawings in which:

FIG. 2A is a cross-sectional view of a region corresponding to a cross-section taken along line X1-X1' of FIG. 1, FIG. 2B is a cross-sectional view of a region corresponding to a cross-section taken along line X2-X2' of FIG. 1, FIG. 2C is a cross-sectional view illustrating some components in a cross-section taken along line Y1-Y1' of FIG. 1, and FIG. 2D is an expanded planar layout illustrating some components of the integrated circuit device shown in FIGS. 2A to 2C;

FIG. 3A is a cross-sectional view of a region corresponding to the cross-section taken along line X1-X1' of FIG. 1, and FIG. 3B is a cross-sectional view illustrating some components in a region corresponding to the cross-section taken along line Y1-Y1' of FIG. 1;

FIG. 4A is a cross-sectional view of a region corresponding to the cross-section taken along line X1-X1' of FIG. 1, and FIG. 4B is a cross-sectional view illustrating some components in a region corresponding to the cross-section taken along line Y1-Y1' of FIG. 1;

FIG. 5A is a cross-sectional view of a region corresponding to the cross-section taken along line X1-X1' of FIG. 1, and FIG. 5B is a cross-sectional view illustrating some components in a region corresponding to the cross-section taken along line Y1-Y1' of FIG. 1;

Figure 1:
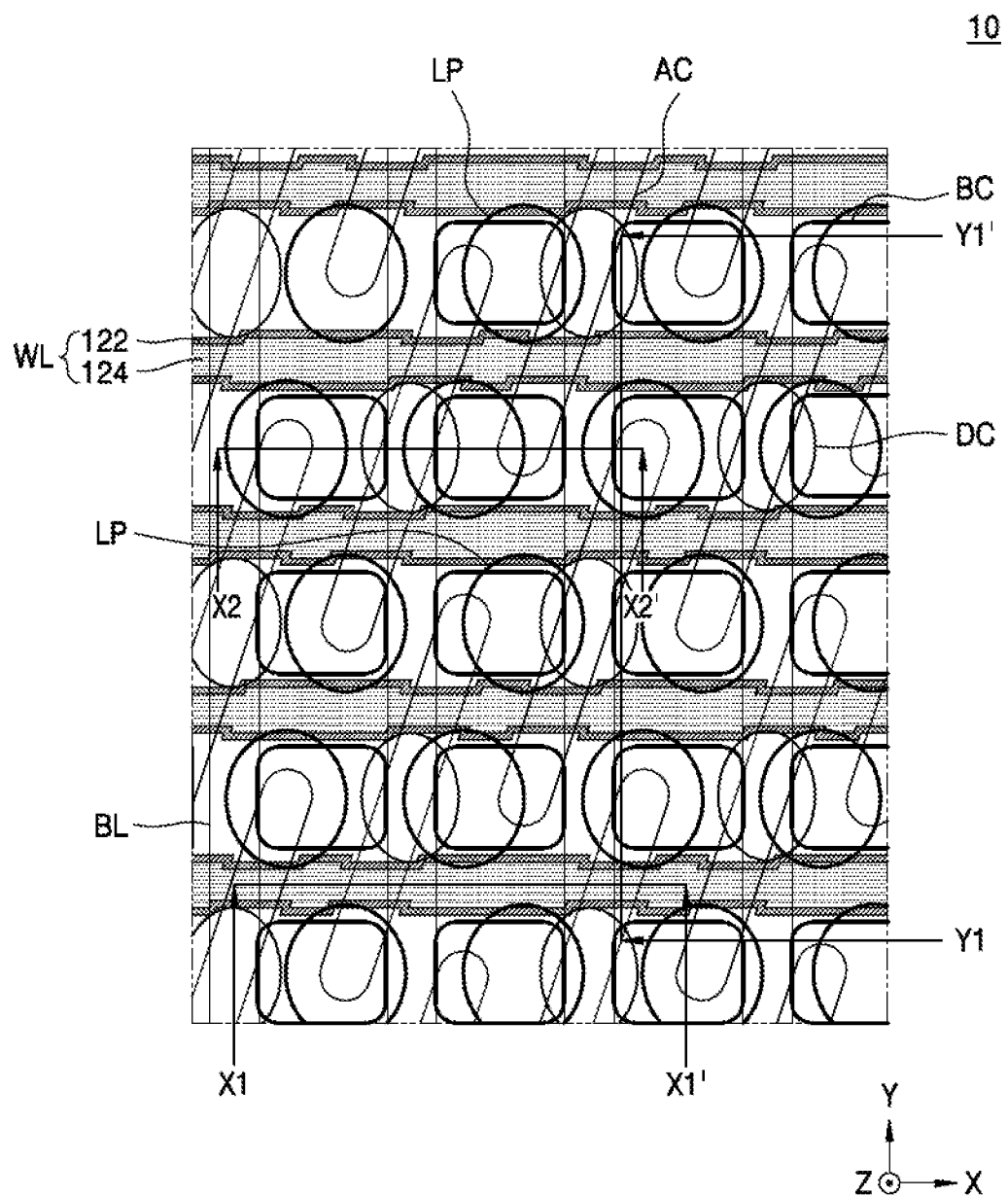
FIG. 1 is a schematic planar layout illustrating main components of a memory cell array area of an integrated circuit device according to an exemplary embodiment of the present inventive concept.

Since the drawings in FIGS. 1-9 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, exemplary embodiments of the present inventive concept will be described in detail with reference to the accompanying drawings. Like components will be denoted by like reference numerals throughout the specification, and repeated descriptions thereof will be omitted.

FIG. 1 is a schematic planar layout illustrating main components of a memory cell array area of an integrated circuit device according to an exemplary embodiment of the present inventive concept.

Referring to FIG. 1, an integrated circuit device 10 may include a plurality of active regions AC spaced apart from each other and extending lengthwise in an oblique direction with respect to a first horizontal direction (X direction) and a second horizontal direction (Y direction) in an X-Y plane. Thus, the second horizontal direction is orthogonal to the first horizontal direction. The plurality of active regions AC may be disposed in a bar-like form of diagonal lines or oblique lines, as illustrated, and by depositing the plurality of active regions AC in a direction of a diagonal line or an oblique line, a maximum possible distance between contacts may be provided for the integrated circuit device 10. A plurality of word lines WL may be spaced apart from each other in the second horizontal direction (Y direction) and extend lengthwise in the first horizontal direction (X direction) across the plurality of active regions AC. In the second horizontal direction (Y direction), portions of the plurality of word lines WL, which are arranged over the plurality of active regions AC, may have widths that are smaller than those of other portions thereof. Thus, each of the plurality of word lines WL may have a variable width in the first horizontal direction (X direction), which is a length direction thereof. The plurality of word lines WL may be arranged at a uniform pitch.

A plurality of bit lines BL may be arranged over the plurality of word lines WL to extend parallel to each other in the second horizontal direction (Y direction), and may be spaced apart from each other in the first horizontal direction (X direction). The plurality of bit lines BL may be connected to the plurality of active regions AC via direct contacts DC, and may be arranged at a uniform pitch. The direct contacts DC may each be arranged on a center region of the active region AC.

A plurality of buried contacts BC may be arranged between two adjacent bit lines BL among the plurality of bit lines BL, and may be arranged on both ends of the plurality of active regions AC. A plurality of conductive landing pads LP may be respectively arranged on the plurality of buried contacts BC. The plurality of buried contacts BC and the plurality of conductive landing pads LP may connect bottom electrodes of capacitors formed over the plurality of bit lines BL to the active regions AC. For example, the plurality of conductive landing pads LP may be arranged between the plurality of buried contacts BC and the bottom electrodes of the capacitors. Each of the plurality of conductive landing pads LP may at least partially overlap a buried contact BC.

Figure 2A:
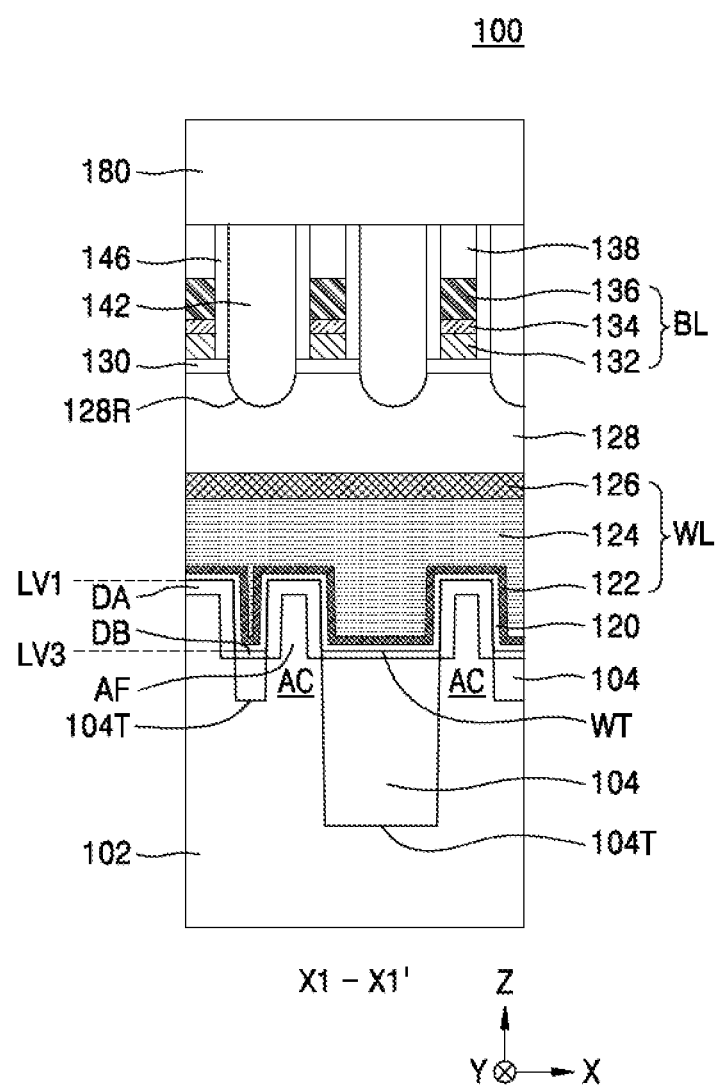
FIGS. 2A to 2D are diagrams illustrating an integrated circuit device according to an exemplary embodiment of the present inventive concept, and in particular.
Figure 2B:
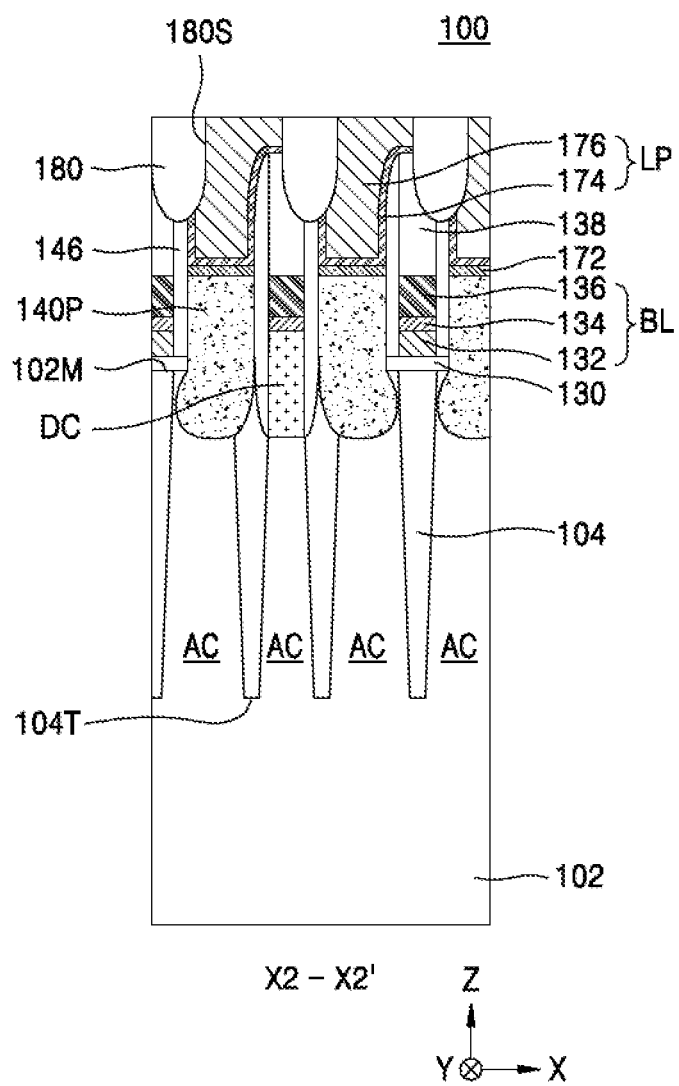
Figure 2C:
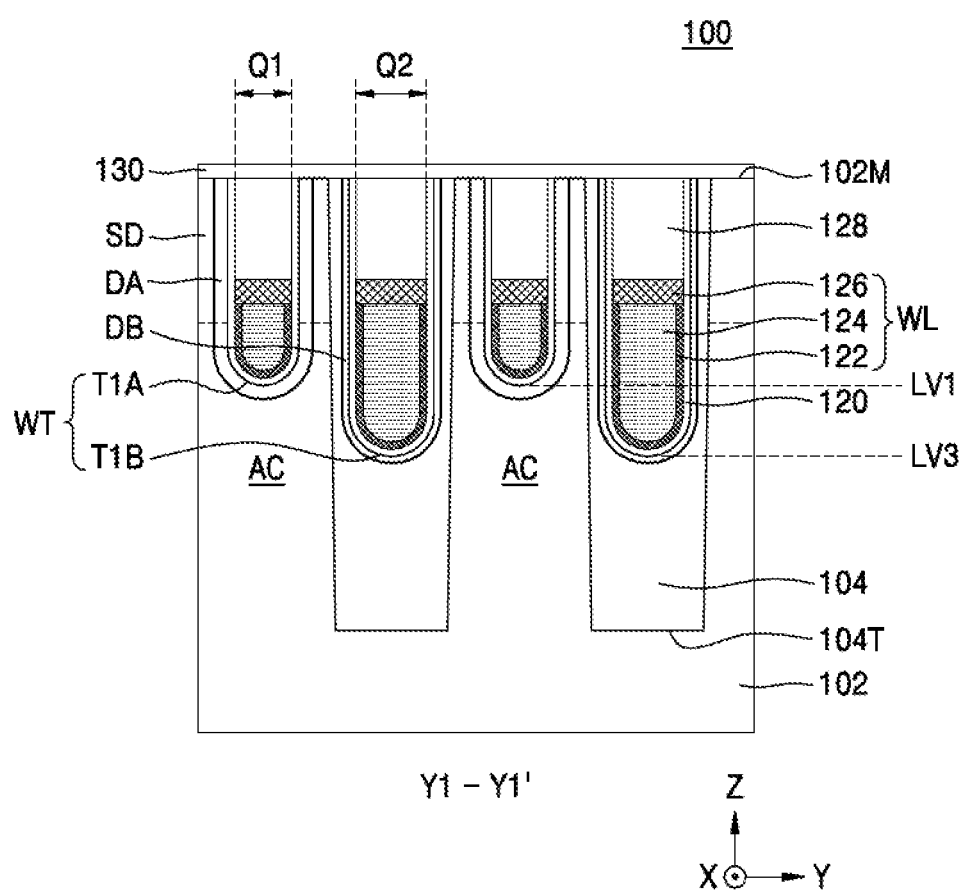
Figure 2D:
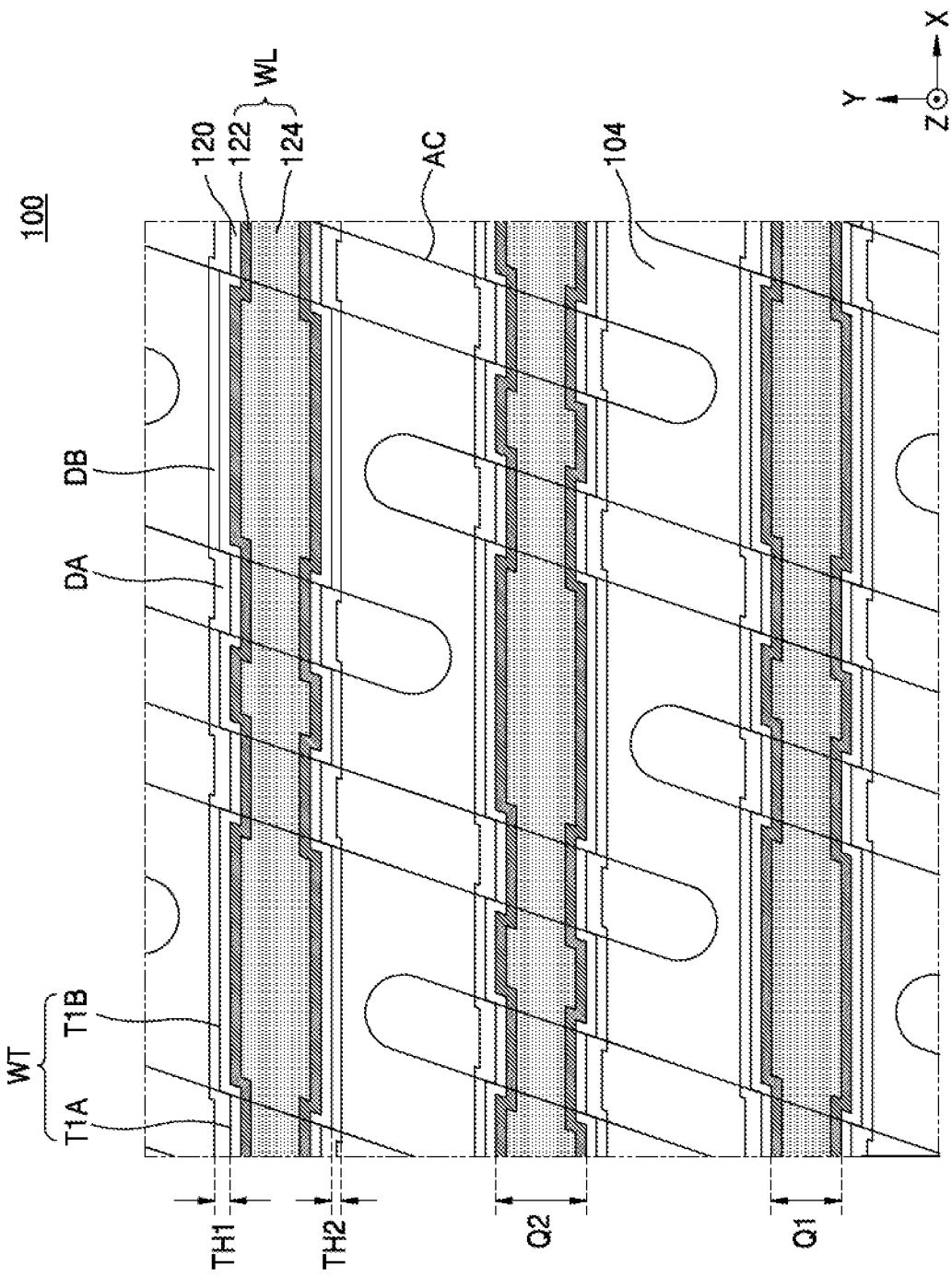

FIGS. 2A to 2D are diagrams illustrating an integrated circuit device according to an exemplary embodiment of the present inventive concept, and in particular, FIG. 2A is a cross-sectional view of a region corresponding to a cross-section taken along line X1-X1' of FIG. 1, FIG. 2B is a cross-sectional view of a region corresponding to a cross-section taken along line X2-X2' of FIG. 1, FIG. 2C is a cross-sectional view illustrating some components in a cross-section taken along line Y1-Y1' of FIG. 1, and FIG. 2D is an enlarged planar layout illustrating some components of the integrated circuit device shown in FIGS. 2A to 2C.

Referring to FIGS. 2A to 2D, an integrated circuit device 100 includes a substrate 102, in which a plurality of active regions AC are defined by a device isolation trench 104T. The device isolation trench 104T may be filled with a device isolation film 104. The device isolation film 104 may be arranged on the substrate 102 to surround the plurality of active regions AC. Thus, the plurality of word lines WL described above with reference to FIG. 1 may be arranged over the plurality of active regions AC and the device isolation film 104 and may extend lengthwise in the first horizontal direction (X direction). The device isolation film 104 may include, for example, a silicon oxide ($SiO_2$) film, a silicon nitride ($Si_3N_4$) film, or a combination thereof. A level of a bottom surface of the device isolation trench 104T may vary with a horizontal width of the device isolation trench 104T. As the horizontal width of the device isolation trench 104T increases, the level of the bottom surface of the device isolation trench 104T may be lower. As used herein, the term "level" refers to a height in a vertical direction (Z direction or –Z direction) from a main surface 102M of the substrate 102.

The substrate 102 may include silicon (Si), for example, single crystalline silicon (Si), polycrystalline silicon (Si), or amorphous silicon (Si). The substrate 102 may be a bulk silicon (Si) substrate or a silicon-on-insulator (SOI) substrate. In an exemplary embodiment of the present inventive concept, the substrate 102 may include at least one selected from, for example, germanium (Ge), silicon germanium (SiGe), silicon carbide (SiC), gallium arsenide (GaAs), indium arsenide (InAs), indium antimonide (InSb), lead telluride (PbTe), gallium phosphide (GaP), gallium antimonide (GaSb) and indium phosphide (InP). In an exemplary embodiment of the present inventive concept, the substrate 102 may include a conductive region, for example, a dopant-doped well or a dopant-doped structure.

A plurality of word line trenches WT are formed in the substrate 102 to extend parallel to each other in the first horizontal direction (X direction). The inside of each of the plurality of word line trenches WT may be filled with a gate dielectric film 120, a word line WL, and a buried insulating film 128.

In the plurality of word line trenches WT, levels of bottom surfaces of portions thereof over the plurality of active regions AC may be higher than levels of bottom surfaces of portions thereof over the device isolation film 104. For example, in a process of forming the plurality of word line trenches WT, an etch rate of the substrate 102 may be different (e.g., may be lower) from an etch rate of the device isolation film 104. Accordingly, after the etching process, the position of the lowermost portion of the word line trench WT formed within the substrate 102 may be different (e.g., may be higher) from the position of the lowermost portion of the word line trench WT formed within the device isolation film 104. Thus, a profile of a bottom surface of each of the plurality of word line trenches WT may have an uneven shape, and a bottom surface of the word line WL may have an uneven shape in correspondence with the profile of the bottom surface of each word line trench WT. A plurality of fin areas AF may be respectively formed in the plurality of active regions AC to protrude upwards in the vertical direction (Z direction) from under the word line WL toward the word line WL in correspondence with the profile of the bottom surface of each word line trench WT.1

Each of the plurality of word line trenches WT may include a first trench portion T1A, which is arranged in the substrate 102 and has a lowest surface at a first level LV1, and a second trench portion T1B, which is arranged in the device isolation film 104 and has a lowest surface at a third level LV3 that is lower than the first level LV1.

The gate dielectric film 120 may conformally cover an inner surface of a word line trench WT to contact an active region AC and the device isolation film 104, and may extend along a sidewall and a bottom surfaces of the word line trench WT. Thus, the gate dielectric film 120 may be arranged between the active region AC (or the substrate 102) and the word line WL and between the device isolation film 104 and the word line WL. The gate dielectric film 120 may include, for example, a silicon oxide ($SiO_2$) film, a silicon oxynitride (SiON) film, an oxide/nitride/oxide (ONO) film, a metal oxide film including a high-k dielectric film, or a combination thereof. The high-k dielectric film is a film having a dielectric constant higher than that of a silicon oxide ($SiO_2$) film, may have a dielectric constant in a range from about 10 to about 25, and may include, for example, hafnium oxide ($HfO_2$), aluminum oxide ($Al_2O_3$), hafnium aluminum oxide ($HfAlO_3$), tantalum oxide ($Ta_2O_3$), lanthanum oxide ($La_2O_3$), lanthanum aluminum oxide ($LaAlO_3$), zirconium oxide ($ZrO_2$), yttrium oxide ($Y_2O_3$) or titanium oxide ($TiO_2$), but the present inventive concept is not limited thereto. In an exemplary embodiment of the present inventive concept, the gate dielectric film 120 may include an oxide film substantially free from an oxide vacancy (which may also be referred to as "Vo" hereinafter), or an oxygen-rich oxide film. For example, the gate dielectric film 120 may include, for example, a silicon oxide ($SiO_2$) film substantially free from an oxide vacancy, a metal oxide film substantially free from an oxide vacancy, an oxygen-rich silicon oxide film, or an oxygen-rich metal oxide film. The gate dielectric film 120 may have a thickness in a range from about 10 nm to about 30 nm.

Each of the plurality of word lines WL may be arranged on the gate dielectric film 120 to partially fill the word line trench WT. In the second horizontal direction (Y direction), a first width Q1 of a portion of the word line WL, which is arranged over the active region AC, may be different from a second width Q2 of a portion of the word line WL, which is arranged over the device isolation film 104. In an exemplary embodiment of the present inventive concept, the second width Q2 of the portion of the word line WL over the device isolation film 104 may be greater than the first width Q1 of the portion of the word line WL over the active region AC.

The word line WL may have a multilayer structure, and may include a metal-containing barrier film 122 conformally covering the gate dielectric film 120, a lower word line 124 having a first work function, and an upper word line 126 having a second work function that is lower than the first work function. The metal-containing barrier film 122 may contact the gate dielectric film 120. The lower word line 124 may be surrounded by the metal-containing barrier film 122 and the upper word line 126. The metal-containing barrier film 122 may include a metal nitride film, and the lower word line 124 may include, for example, a metal, a metal nitride, a metal carbide, or a combination thereof. In an exemplary embodiment of the present inventive concept, the metal-containing barrier film 122 may include, for example, titanium nitride (TiN), tantalum nitride (TaN), tungsten nitride (WN), or a combination thereof. In an exemplary embodiment of the present inventive concept, the lower word line 124 may include, for example, titanium (Ti), titanium nitride (TiN), titanium carbide (TiC), tantalum (Ta), tantalum nitride (TaN), tantalum carbide (TaC), tungsten (W), tungsten nitride (WN), tungsten carbide (WC), titanium silicon nitride (TiSiN), tungsten silicon nitride (WSiN), aluminum (Al), copper (Cu), cobalt (Co), nickel (Ni), platinum (Pt), rhodium (Rh), palladium (Pd), iridium (Ir), osmium (Os), silver (Ag), gold (Au), zinc (Zn), vanadium (V), or a combination thereof. The upper word line 126 may include doped polysilicon. For example, the metal-containing barrier film 122 may include TiN, the lower word line 124 may include W, and the upper word line 126 may include doped polysilicon, but the present inventive concept is not limited thereto. In an exemplary embodiment of the present inventive concept, at least one selected from the metal-containing barrier film 122 and the upper word line 126 may be omitted.

The buried insulating film 128 may be arranged on each of the plurality of word lines WL to fill the remaining space of the word line trench WT, and may include, for example, a silicon nitride ($Si_3N_4$) film, a silicon oxynitride (SiON) film, a silicon oxide ($SiO_2$) film, a silicon carbonitride (SiCN) film, a silicon oxycarbonitride (SiOCN) film, or a combination thereof.

A plurality of source/drain regions SD are formed in the plurality of active regions AC on both sides of the plurality of word lines WL.

The integrated circuit device 100 may include a first impurity region DA arranged between the substrate 102 and the gate dielectric film 120, and a second impurity region DB arranged between the device isolation film 104 and the gate dielectric film 120. Each of the first impurity region DA and the second impurity region DB may extend along an inner wall of the word line trench WT while surrounding a bottom surface of the word line trench WT.

Each of the first impurity region DA and the second impurity region DB may include dopant ions selected from among, for example, oxygen (O) ions, silicon (Si) ions, helium (He) ions, argon (Ar) ions, fluorine (F) ions, and combinations thereof. As used herein, the term "dopant" may be a component different from or the same as a main component of a target film, into which the dopant is implanted. When the dopant is a component different from the main component of the target film, the dopant may be implanted into the target film, whereby the dopant may be placed at interstitial positions in a crystal structure constituting the target film, may be substituted for atoms of the main component of the target film, or may accelerate the movement of ambient atoms around implanted positions of the dopant to lattice points. When the dopant is a component the same as the main component of the target film, the dopant may be implanted into the target film, whereby the crystal structure in the target film may be changed or a crystalline structure of the target film may be amorphized. For example, in addition to inserting the dopant to the target film, the ion implantation may damage the crystal structure through lattice displacements by energy transfer to the lattice atoms. Lattice displacements occur when the energy transferred to a lattice atom through nuclear collisions. Displacement of a lattice atom may produce both an interstitial atom and a vacancy, and thus the crystal structure may be changed or may be amorphized.

The first impurity region DA may have a first thickness TH1. The second impurity region DB may have a second thickness TH2 that is smaller than the first thickness TH1 of the first impurity region DA. Here, the first thickness TH1 of the first impurity region DA refers to a minimum distance from an inner wall of the first trench portion T1A to an interface between the first impurity region DA and the substrate 102, and the second thickness TH2 of the second impurity region DB refers to a minimum distance from an inner wall of the second trench portion T1B to an interface between the second impurity region DB and the device isolation film 104. Because an ion-implanted portion of the device isolation film 104 may be partially etched by an etchant in a subsequent process, the ion-implanted portion of the device isolation film 104 may have its thickness reduced in the subsequent process, resulting in forming the second impurity region DB having the second thickness TH2 smaller than the first thickness TH1 of the first impurity region DA. For example, the first thickness TH1 of the first impurity region DA may be selected from a range of about 10 nm to about 20 nm, and the second thickness TH2 of the second impurity region DB may be selected from a range of about 5 nm to about 15 nm and may be smaller than the first thickness TH1 of the first impurity region DA. However, the respective thicknesses of the first impurity region DA and the second impurity region DB are not limited to the examples set forth above.

In an exemplary embodiment of the present inventive concept, when the substrate 102 includes a crystalline semiconductor and the dopant ions included in the first impurity region DA include, for example, oxygen (O) ions, silicon (Si) ions, helium (He) ions, argon (Ar) ions, fluorine (F) ions, or a combination thereof, the first impurity region DA may include an amorphous semiconductor layer including interstitial atoms that include the dopant ions. For example, when the substrate 102 includes crystalline silicon and the dopant ions included in the first impurity region DA include oxygen (O) ions, the first impurity region DA may include an amorphous silicon layer, and oxygen (O) atoms derived from the dopant ions may be present as interstitial oxygen (O) in the first impurity region DA. For example, the oxygen (O) ions may be implanted into the substrate 102 including the crystalline silicon, whereby the oxygen (O) ion-implanted portion of the substrate 102 may be amorphized to form the first impurity region DA including an amorphous silicon layer which includes interstitial oxygen (O).

The second impurity region DB may include an insulating film including dopant ions selected from, for example, oxygen (O) ions, silicon (Si) ions, helium (He) ions, argon (Ar) ions, fluorine (F) ions, and combinations thereof. When the device isolation film 104 includes, for example, a silicon oxide ($SiO_2$) film, a silicon nitride ($Si_3N_4$) film, or a combination thereof and the dopant ions included in the second impurity region DB include oxygen (O) ions, the second impurity region DB may include, for example, an oxygen-rich silicon oxide film, a silicon oxynitride (SiON) film, or a combination thereof. As used herein, the term "oxygen-rich silicon oxide film" refers to a silicon oxide film having oxygen (O) atom content that is higher than stoichiometric oxygen (O) atom content in a $SiO_2$ film. When the device isolation film 104 includes, for example, a silicon oxide ($SiO_2$) film, a silicon nitride ($Si_3N_4$) film, or a combination thereof and the dopant ions included in the second impurity region DB include silicon (Si) ions, the second impurity region DB may include, for example, a silicon-rich silicon oxide film, a silicon-rich silicon nitride ($Si_3N_4$) film, or a combination thereof. As used herein, the term "silicon-rich silicon oxide film" refers to a silicon oxide film having silicon atom content that is higher than stoichiometric silicon atom content in a $SiO_2$ film. As used herein, the term "silicon-rich silicon nitride film" refers to a silicon nitride ($Si_3N_4$) film having silicon atom content that is higher than stoichiometric silicon atom content in a $Si_3N_4$ film.

The second impurity region DB includes dopant ions selected from, for example, oxygen (O) ions, silicon (Si) ions, helium (He) ions, argon (Ar) ions, fluorine (F) ions, and combinations thereof, whereby a crystal structure of a main component of the second impurity region DB may be in a disruption state due to the dopant ions set forth above. In an exemplary embodiment of the present inventive concept, the second impurity region DB may include interstitial atoms including the dopant ions set forth above and interstitial oxygen (O) derived from a silicon oxide ($SiO_2$) film, which is a main component film of the second impurity region DB. Therefore, the second impurity region DB may include the main component film having a damaged lattice structure, for example, a silicon oxide ($SiO_2$) film having a damaged lattice structure. For example, the oxygen (O) ions may be implanted into the device isolation film 104 including the silicon oxide ($SiO_2$) lattice structure, whereby the oxygen (O) ion-implanted portion of the device isolation film 104 may have its lattice structure damaged to form the second impurity region DB including a silicon oxide ($SiO_2$) layer having a damaged lattice structure which includes interstitial oxygen (O).

The dopant ions, which are present in the first impurity region DA and the second impurity region DB, or interstitial oxygen (O) caused by the dopant ions may move to an interface between the substrate 102 and the gate dielectric film 120 or move into the gate dielectric film 120, whereby an oxygen (O) vacancy (referred to as "Vo" hereinafter) may not be substantially included in the gate dielectric film 120 or at the interface between the substrate 102 and the gate dielectric film 120. For example, the oxygen (O) vacancy in the gate dielectric film 120 or at the interface between the substrate 102 and the gate dielectric film 120 may be extinguished by the dopant ion or the interstitial oxygen (O).

Generally, when Vo's are present in the gate dielectric film 120 and at the interface between the substrate 102 and the gate dielectric film 120, this may cause the deterioration of a transistor including the gate dielectric film 120. To secure stable electrical characteristics in a transistor including the gate dielectric film 120, there is a need to reduce the Vo's in the gate dielectric film 120 and at the interface between the substrate 102 and the gate dielectric film 120. When the gate dielectric film 120 includes a silicon oxide ($SiO_2$) film, there may be a dangling bond due to the breaking of a bond between a silicon atom and an oxygen (O) atom, at and near the interface between the substrate 102 and the gate dielectric film 120. Such a dangling bond may be in a metastable state by capturing hydrogen (H) supplied from ambient films, and such a region capturing hydrogen (H) may, unintentionally, become an electron trap capable of capturing electrons or become a generation source of electrons. As such, Vo's may have an adverse effect in controlling a threshold voltage of a transistor by capturing hydrogen (H). Also, the Vo-H bond formed by bonding between hydrogen (H) supplied from ambient films and a Vo of the gate dielectric film 120 may be broken during the use of a final product by a user, the threshold voltage of the transistor may be changed toward an unintended direction and may cause defect formation. Therefore, not to exert an adverse effect on electrical characteristics of a transistor, there is a need to reduce Vo density at or near the interface between the gate dielectric film 120 and the substrate 102.

According to at least one embodiment of the present inventive concept, interstitial oxygen (O) in the first impurity region DA and the second impurity region DB, which contact and surround the gate dielectric film 120, may move to the interface between the gate dielectric film 120 and the first impurity region DA, to the interface between the gate dielectric film 120 and the second impurity region DB, and into the gate dielectric film 120, and as a result, excess oxygen (O) may be supplied to the interfaces set forth above and into the gate dielectric film 120. Thus, at the interfaces set forth above and in the gate dielectric film 120, Vo's are filled with oxygen (O) and are in a stable state, whereby the Vo's may be extinguished or the density of Vo's may be significantly reduced. Accordingly, issues caused by the presence of dangling bonds, which may be oxide vacancies Vo's, at the interfaces set forth above and the presence of oxide vacancies Vo's in the gate dielectric film 120 may be alleviated by extinguishing the dangling bonds and the oxide vacancies Vo's with the interstitial oxygen (O) formed in the first impurity region DA and the second impurity region DB. As used herein, the term "excess oxygen" refers to oxygen (O) that exceeds stoichiometric oxygen (O) content in an oxide constituting the gate dielectric film 120. The excess oxygen (O) derived from the first impurity region DA and the second impurity region DB may move between the first impurity region DA, the second impurity region DB, and the gate dielectric film 120. The movement of the excess oxygen (O) may include a case of the movement thereof between the first impurity region DA, the second impurity region DB, and the gate dielectric film 120 and a case of the movement thereof by being replaced by oxygen (O) constituting each of the first impurity region DA, the second impurity region DB, and the gate dielectric film 120. Alternatively, a Vo in the gate dielectric film 120 may consecutively capture an oxygen (O) atom adjacent thereto, whereby a position of the Vo may be moved.

The Vo may be in a metastable state when capturing hydrogen, whereas the Vo may be in a stable state when capturing oxygen (O). According to the present inventive concept, before the Vo at the interfaces set forth above and in the gate dielectric film 120 captures hydrogen for healing a dangling bond in a subsequent process, the excess oxygen (O) derived from the first impurity region DA and the second impurity region DB may be supplied to the interfaces set forth above and into the gate dielectric film 120 to extinguish the Vo and to heal the dangling bond, whereby the interfaces set forth above and the inside of the gate dielectric film 120 may be in a stable state. Therefore, in a transistor including the gate dielectric film 120, the threshold voltage may be precisely controlled and stable electrical characteristics may be secured.

The main surface 102M of the substrate 102, the device isolation film 104, and the buried insulating film 128 may be covered with a buffer insulating film 130. The buffer insulating film 130 may include, for example, an oxide film, a nitride film, or a combination thereof.

A plurality of direct contacts DC may be respectively arranged on portions of the plurality of active regions AC. The plurality of bit lines BL may be arranged on the buffer insulating film 130 and the plurality of direct contacts DC and extend lengthwise in the second horizontal direction (Y direction), and may be electrically connected to the plurality of active regions AC via the plurality of direct contacts DC. The plurality of bit lines BL may be respectively covered with a plurality of insulating capping patterns 138.

A plurality of conductive plugs 140P and a plurality of insulating fences 142 may be alternately and repeatedly arranged in a line in the second horizontal direction (Y direction) between a pair of adjacent bit lines BL among the plurality of bit lines BL. The plurality of insulating fences 142 may respectively fill a plurality of recesses 128R, which are formed in a top surface of the buried insulating film 128, and may be arranged one by one between the plurality of conductive plugs 140P. In the second horizontal direction (Y direction), both sidewalls of each of the plurality of conductive plugs 140P may be covered with the plurality of insulating fences 142. The plurality of conductive plugs 140P arranged in a line in the second horizontal direction (Y direction) may be insulated from each other by the plurality of insulating fences 142. For example, the plurality of insulating fences 142 may limit or define positions of the plurality of conductive plugs 140P, and may be adjacent to the sidewalls of the pair of adjacent bit lines BL and the pair of adjacent insulating capping patterns 138. The plurality of conductive plugs 140P may respectively constitute the plurality of buried contacts BC shown in FIG. 1.

Each of the plurality of bit lines BL may be connected to the active region AC via a direct contact DC. One direct contact DC and a pair of conductive plugs 140P, which face each other with the one direct contact DC arranged therebetween, may be respectively connected to different active regions AC from each other among the plurality of active regions AC. In an exemplary embodiment of the present inventive concept, the direct contact DC may include, for example, silicon (Si), germanium (Ge), tungsten (W), tungsten nitride (WN), cobalt (Co), nickel (Ni), aluminum (Al), molybdenum (Mo), ruthenium (Ru), titanium (Ti), titanium nitride (TiN), tantalum (Ta), tantalum nitride (TaN), copper (Cu), or a combination thereof. For example, the direct contact DC may include an epitaxial silicon layer.

Each of the plurality of bit lines BL may include a lower conductive layer 132, an intermediate conductive layer 134, and an upper conductive layer 136, which are sequentially formed over the substrate 102 in this stated order. A top surface of the lower conductive layer 132 and a top surface of the direct contact DC may extend on the same plane. Although FIGS. 2A and 2B illustrate that each of the plurality of bit lines BL has a triple layer structure including the lower conductive layer 132, the intermediate conductive layer 134, and the upper conductive layer 136, the present inventive concept is not limited thereto. For example, each of the plurality of bit lines BL may have a single layer structure, a double layer structure, or a stack structure of a plurality of layers including four or more layers. In an exemplary embodiment of the present inventive concept, the lower conductive layer 132 may include conductive polysilicon. Each of the intermediate conductive layer 134 and the upper conductive layer 136 may include, for example, titanium (Ti), titanium nitride (TiN), titanium silicon nitride (TiSiN), tantalum (Ta), tantalum nitride (TaN), tungsten (W), tungsten silicide (WSi), tungsten nitride (WN) or a combination thereof. For example, the intermediate conductive layer 134 may include titanium nitride (TiN) and/or titanium silicon nitride (TiSiN), and the upper conductive layer 136 may include tungsten (W). Each of the plurality of insulating capping patterns 138 may include, for example, a silicon nitride ($Si_3N_4$) film, or a silicon oxynitride (SiON) film.

Each of the plurality of conductive plugs 140P may have a pillar shape extending, on the substrate 102, in the vertical direction (Z direction) along a space between the plurality of bit lines BL. A bottom surface of each of the plurality of conductive plugs 140P may contact the active region AC. A portion of each of the plurality of conductive plugs 140P may be located at a level lower than that of the main surface 102M of the substrate 102. Each of the plurality of conductive plugs 140P may include, for example, a dopant-doped semiconductor material, a metal, a conductive silicide, a conductive metal nitride, or a combination thereof.

Each of the plurality of insulating fences 142 may have a pillar shape extending in the vertical direction (Z direction) between the plurality of bit lines BL, and may include a silicon nitride ($Si_3N_4$) film. Other insulating film such as, for example, a silicon oxide ($SiO_2$) film, or a silicon oxynitride (SiON) film may also be used for each of the plurality of insulating fences 142.

Both sidewalls of each of the plurality of bit lines BL, the plurality of insulating capping patterns 138, and the plurality of direct contacts DC may be covered with a plurality of insulating spacers 146. The plurality of insulating spacers 146 may be arranged on both sidewalls of the plurality of bit lines BL to extend lengthwise parallel to the plurality of bit lines BL in the second horizontal direction (Y direction). Each of the plurality of insulating spacers 146 may include, for example, an oxide film, a nitride film, an air spacer, or a combination thereof. As used herein, the term "air" may refer to a space including the atmosphere or other gases that may be present during a manufacturing process.

Each of the plurality of conductive plugs 140P may be apart from a bit line BL in the first horizontal direction (X direction) with an insulating spacer 146 interposed therebetween. Each of the plurality of insulating fences 142 may be apart from the bit line BL in the first horizontal direction (X direction) with the insulating spacer 146 interposed therebetween. In an exemplary embodiment of the present inventive concept, an air gap region may be formed to combine with the nitride film and/or oxide film to form each of the plurality of insulating spacers 146. As the air gap region is filled with air whose dielectric constant is less than that of silicon oxide ($SiO_2$), the integrated circuit device 100 may decrease in parasitic capacitance between the bit line BL and the conductive plug 140P. Moreover, as the air gap region is disposed between the bit line BL and the insulation fence 40, capacitance distribution of the bit line BL may be reduced.

A metal silicide film 172 and a conductive landing plug LP may be sequentially formed on a conductive plug 140P in this stated order. The metal silicide film 172 and the conductive landing plug LP may be arranged to vertically overlap the conductive plug 140P. Each of a plurality of metal silicide films 172 is apart from the bit line BL with the insulating spacer 146 interposed therebetween, and is arranged between the conductive plug 140P and the conductive landing plug LP. The metal silicide film 172 may include, for example, cobalt silicide ($CoSi_2$), nickel silicide ($NiSi_2$), or manganese silicide ($MnSi_2$).

Each of the plurality of conductive landing plugs LP may be connected to the conductive plug 140P via the metal silicide film 172. The plurality of conductive landing plugs LP may extend from spaces between the plurality of insulating capping patterns 138 to spaces over the plurality of insulating capping patterns 138 to vertically overlap portions of the plurality of bit lines BL. For example, the conductive landing plug LP may vertically overlap a side wall of the bit line BL, and may have a width greater than that of the conductive plug 140P in the second horizontal direction (Y direction). A center of the conductive landing plug LP may shift in the first horizontal direction (X direction) away from a center of the conductive plug 140P. Each of the plurality of conductive landing plugs LP may include a conductive barrier film 174 and a conductive layer 176. The conductive barrier film 174 may include, for example, titanium (Ti), titanium nitride (TiN), or a combination thereof. The conductive layer 176 may include, for example, a metal, a metal nitride, conductive polysilicon, or a combination thereof. For example, the conductive layer 176 may include tungsten (W).

The plurality of conductive landing plugs LP may have shapes of a plurality of island patterns in a plan view. The plurality of conductive landing plugs LP may be electrically insulated from each other by an insulating film 180 filling an insulating space 180S therearound. The insulating film 180 may include, for example, a silicon nitride ($Si_3N_4$) film, a silicon oxide ($SiO_2$) film, or a combination thereof.

In the integrated circuit device 100 shown in FIGS. 2A to 2D, widths (e.g., second widths Q2) of portions of the plurality of word lines WL, which are located over the device isolation film 104, may be greater than widths (e.g., first widths Q1) of portions of the plurality of word lines WL, which are located over the active regions AC of the substrate 102. Thus, spaces occupied by those portions of the plurality of word lines WL located over the device isolation film 104 may be enlarged, resulting in an increase in the volume of the word line WL. Therefore, the resistance of the plurality of word lines WL may be reduced. In addition, because the integrated circuit device 100 includes the first impurity region DA and the second impurity region DB, which contact the gate dielectric film 120, interstitial oxygen (O) generated due to the dopant ions included in the first impurity region DA and the second impurity region DB may move to the interface between the gate dielectric film 120 and the first impurity region DA, to the interface between the gate dielectric film 120 and the second impurity region DB, and into the gate dielectric film 120, and excess oxygen (O) is supplied to the interfaces set forth above and into the gate dielectric film 120, whereby, at the interfaces set forth above and in the gate dielectric film 120, a Vo may be filled with oxygen (O) and be in a stable state. Therefore, in a transistor including the gate dielectric film 120, the threshold voltage may be precisely controlled and stable electrical characteristics may be secured.

Figure 3A:
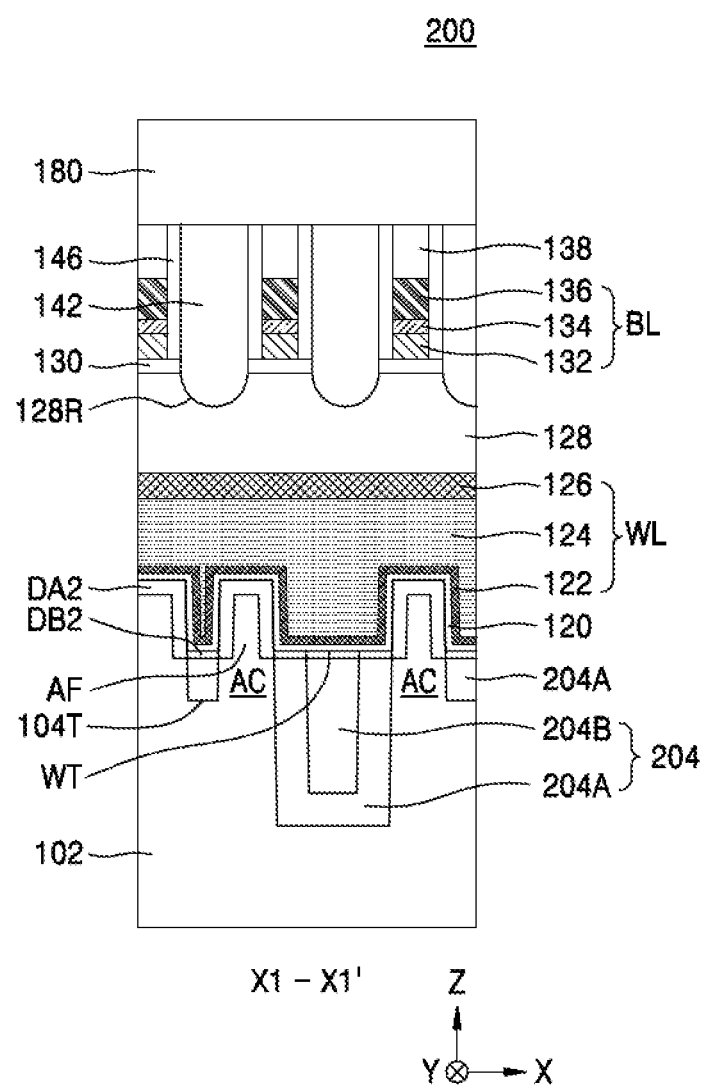
FIGS. 3A and 3B are diagrams illustrating an integrated circuit device according to an exemplary embodiment of the present inventive concept, and in particular.
Figure 3B:
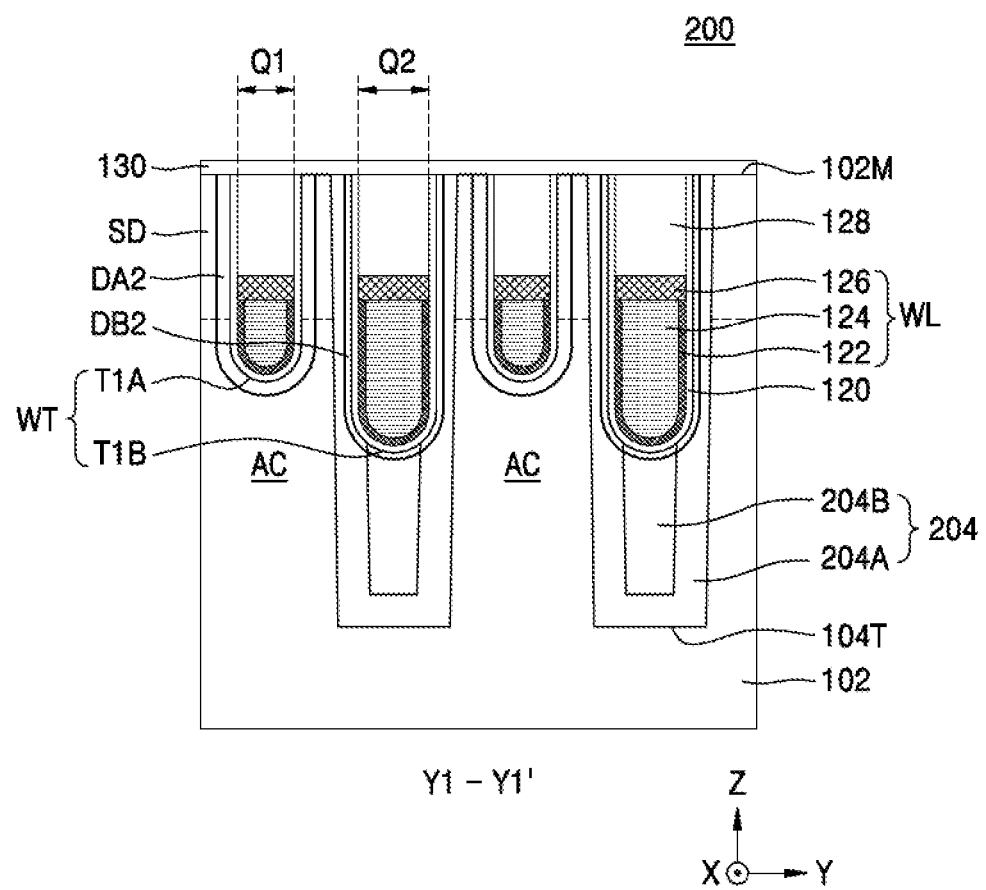

FIGS. 3A and 3B are diagrams illustrating an integrated circuit device according to an exemplary embodiment of the present inventive concept, and in particular, FIG. 3A is a cross-sectional view of a region corresponding to the cross-section taken along line X1-X1' of FIG. 1, and FIG. 3B is a cross-sectional view illustrating some components in a region corresponding to the cross-section taken along line Y1-Y1' of FIG. 1. In FIGS. 3A and 3B, the reference numerals the same as those in FIGS. 2A to 2D respectively denote the same members, and repeated descriptions thereof will be omitted.

Referring to FIGS. 3A and 3B, an integrated circuit device 200 has a configuration substantially identical to that of the integrated circuit device 100 described with reference to FIGS. 2A to 2D. The integrated circuit device 200 may have the planar layout configuration shown in FIGS. 1 and 2D. However, the integrated circuit device 200 includes a device isolation film 204 having a multilayer structure instead of the device isolation film 104.

The device isolation film 204 may include an insulating liner 204A and a gap-fill insulating film 204B, which are sequentially formed in the device isolation trench 104T in this stated order. The insulating liner 204A in the device isolation trench 104T may have a structure surrounding the gap-fill insulating film 204B. In an exemplary embodiment of the present inventive concept, the insulating liner 204A may include a silicon oxide ($SiO_2$) film and the gap-fill insulating film 204B may include a silicon nitride ($Si_3N_4$) film, but the present inventive concept is not limited thereto.

In the integrated circuit device 200, a first impurity region DA2 may be arranged between the substrate 102 and the gate dielectric film 120. A second impurity region DB2 may be arranged between the device isolation film 204 and the gate dielectric film 120. In an exemplary embodiment of the present inventive concept, each of the first impurity region DA2 and the second impurity region DB2 may include dopant ions selected from among, for example, oxygen (O) ions, silicon (Si) ions, helium (He) ions, argon (Ar) ions, fluorine (F) ions, and combinations thereof. The first impurity region DA2 and the second impurity region DB2 may respectively have configurations substantially the same as those described regarding the first impurity region DA and the second impurity region DB shown in FIGS. 2A, 2C, and 2D.

In an exemplary embodiment of the present inventive concept, when the insulating liner 204A includes a silicon oxide ($SiO_2$) film and the gap-fill insulating film 204B includes a silicon nitride ($Si_3N_4$) film and when the dopant ions include oxygen (O) ions, a portion of the second impurity region DB2, which faces the insulating liner 204A, may include an oxygen-rich silicon oxide film, and a portion of the second impurity region DB2, which faces the gap-fill insulating film 204B, may include a silicon oxynitride (SiON) film. Thus, the integrated circuit device 200 includes the first impurity region DA2 and the second impurity region DB2, which have excess oxygen (O) and contact the gate dielectric film 120, whereby, at an interface between the gate dielectric film 120 and the first impurity region DA2, at an interface between the gate dielectric film 120 and the second impurity region DB2, and in the gate dielectric film 120, Vo's may be extinguished or the density of Vo's may be significantly reduced by the excess oxygen (O) supplied by the first impurity region DA2 and the second impurity region DB2. Therefore, in a transistor including the gate dielectric film 120, the threshold voltage may be precisely controlled and stable electrical characteristics may be secured.

Figure 4A:
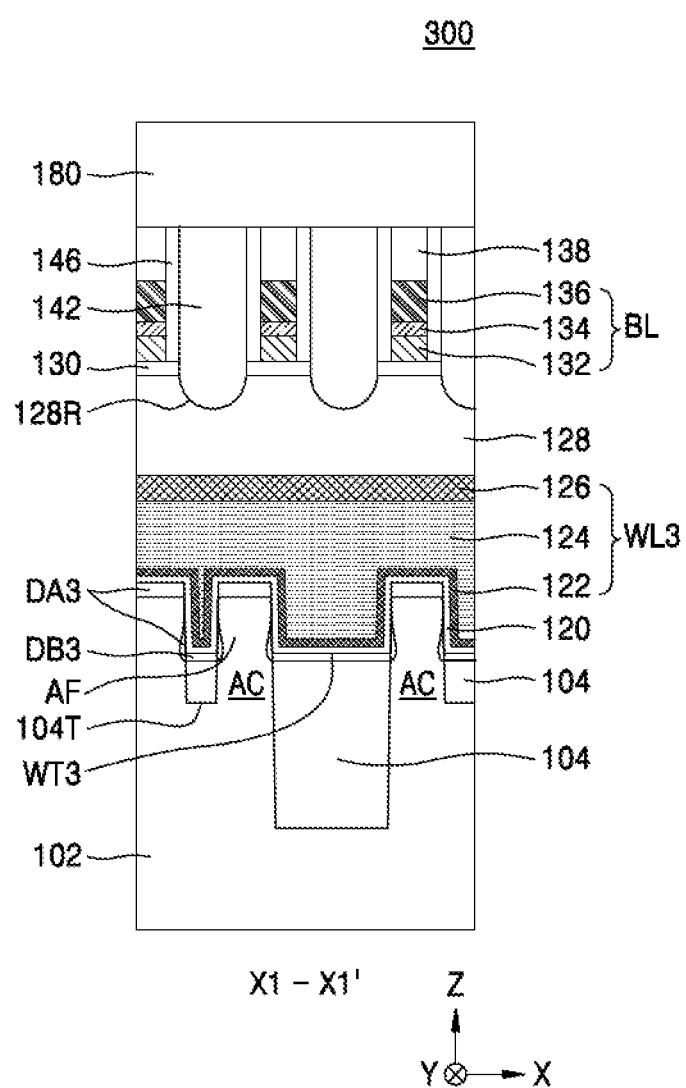
FIGS. 4A and 4B are diagrams illustrating an integrated circuit device according to an exemplary embodiment of the present inventive concept, and in particular.
Figure 4B:
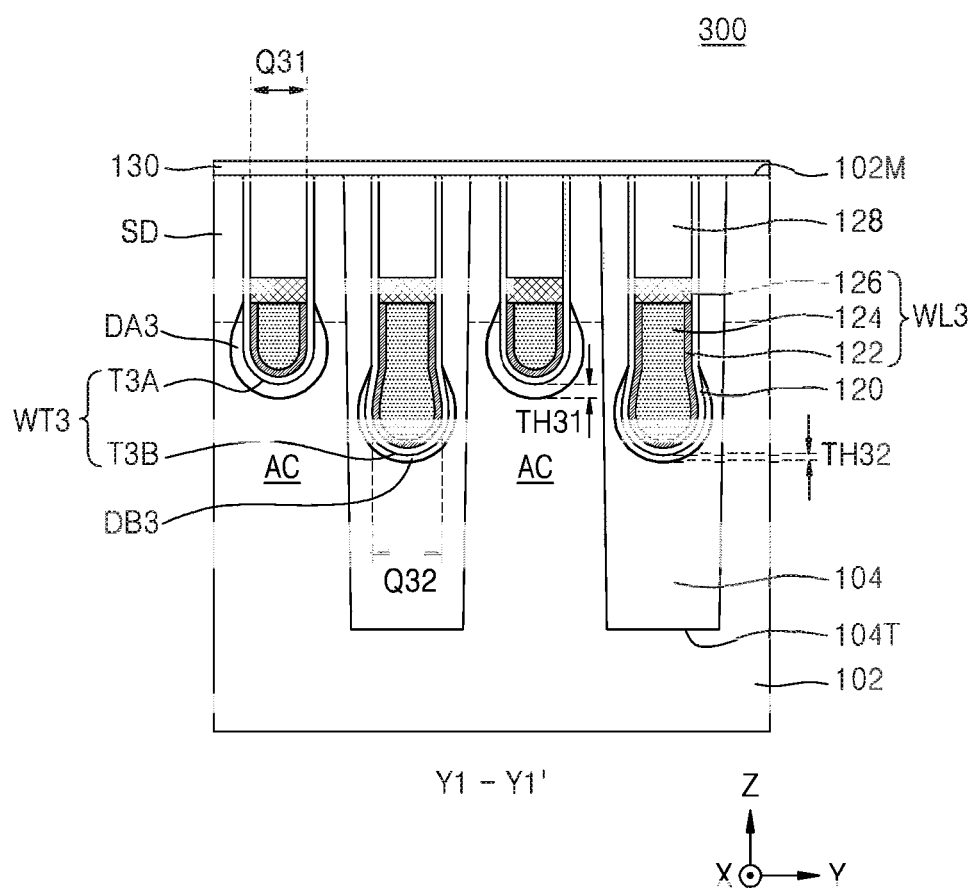

FIGS. 4A and 4B are diagrams illustrating an integrated circuit device according to an exemplary embodiment of the present inventive concept, and in particular, FIG. 4A is a cross-sectional view of a region corresponding to the cross-section taken along line X1-X1' of FIG. 1, and FIG. 4B is a cross-sectional view illustrating some components in a region corresponding to the cross-section taken along line Y1-Y1' of FIG. 1. In FIGS. 4A and 4B, the reference numerals the same as those in FIGS. 2A to 2D respectively denote the same members, and repeated descriptions thereof will be omitted.

Referring to FIGS. 4A and 4B, an integrated circuit device 300 has a configuration substantially identical to that of the integrated circuit device 100 described with reference to FIGS. 2A to 2D. The integrated circuit device 300 may have the planar layout configuration shown in FIG. 1. However, the integrated circuit device 300 may include: a plurality of word line trenches WT3 extending, in the substrate 102, parallel to each other in the first horizontal direction (X direction); a first impurity region DA3 arranged between the substrate 102 and the gate dielectric film 120 to extend along a portion of an inner wall of each word line trench WT3; and a second impurity region DB3 arranged between the device isolation film 104 and the gate dielectric film 120 to extend along a portion of the inner wall of each word line trench WT3.

Each of the plurality of word line trenches WT3 may include a first trench portion T3A in the substrate 102 and a second trench portion T3B in the device isolation film 104. The first trench portion T3A may have a configuration substantially identical to that of the first trench portion T1A shown in FIGS. 2A, 2C, and 2D. In the second horizontal direction (Y direction), a lower width of the second trench portion T3B may be greater than an upper width thereof. In the second horizontal direction (Y direction), the upper width of the second trench portion T3B may be approximately equal or similar to the width of the first trench portion T3A.

The inside of each of the plurality of word line trenches WT3 may be filled with the gate dielectric film 120, a word line WL3, and the buried insulating film 128. A plurality of word lines WL3 may have a configuration substantially the same as that described regarding the plurality of word lines WL shown in FIGS. 2A, 2C, and 2D. However, in the second horizontal direction (Y direction), lower widths of portions of the plurality of word lines WL3, of which each fills the second trench portion T3B, may be greater than upper widths thereof. Thus, in the second horizontal direction (Y direction), lower widths of portions of the plurality of word lines WL3 arranged over the device isolation film 104 may be greater than upper widths thereof. In the second horizontal direction (Y direction), a portion of each of the plurality of word lines WL3, which fills the first trench portion T3A, may have a first width Q31, and a portion of each of the plurality of word lines WL3, which fills a lower portion of the second trench portion T3B, may have a second width Q32 that is greater than the first width Q31 set forth above. As such, the portions of the plurality of word lines WL3, which are arranged over the device isolation film 104, may have relatively large widths, thereby reducing the resistance of the plurality of word lines WL3. For example, spaces occupied by those portions of the plurality of word lines WL3 located over the device isolation film 104 may be enlarged, resulting in an increase in the volume of the plurality of word lines WL3. Therefore, the resistance of the plurality of word lines WL3 may be reduced.

The first impurity region DA3 and the second impurity region DB3 may respectively have configurations substantially the same as those described regarding the first impurity region DA and the second impurity region DB shown in FIGS. 2A, 2C, and 2D. However, the first impurity region DA3 and the second impurity region DB3 may not be formed in regions adjacent to the main surface 102M of the substrate 102 and in regions adjacent to a top surface of the device isolation film 104, respectively. The first impurity region DA3 may not be formed on an upper portion of a sidewall of the first trench portion T3A. The second impurity region DB3 may not be formed on an upper portion of a sidewall of the second trench portion T3B. The first impurity region DA3 may be arranged along an inner sidewall of the first trench portion T3A at a position apart from the main surface 102M of the substrate 102, and may surround only a portion of the gate dielectric film 120, which is adjacent to a bottom surface of the first trench portion T3A. The second impurity region DB3 may be arranged along an inner sidewall of the second trench portion T3B at a position apart from the top surface of the device isolation film 104, and may surround only a portion of the gate dielectric film 120, which is adjacent to a bottom surface of the second trench portion T3B.

A second thickness TH32 of the second impurity region DB3 may be smaller than a first thickness TH31 of the first impurity region DA3. Because an ion-implanted portion of the device isolation film 104 may be partially etched by an etchant in a subsequent process, the ion-implanted portion of the device isolation film 104 may have its thickness reduced in the subsequent process, resulting in forming the second impurity region DB3 having the second thickness TH32 smaller than the first thickness TH31 of the first impurity region DA3. For example, the first thickness TH31 of the first impurity region DA3 may be selected from a range of about 10 nm to about 20 nm, and the second thickness TH32 of the second impurity region DB3 may be selected from a range of about 5 nm to about 15 nm and may be smaller than the first thickness TH31 of the first impurity region DA3. However, the respective thicknesses of the first impurity region DA3 and the second impurity region DB3 are not limited to the examples set forth above.

In the integrated circuit device 300 shown in FIGS. 4A and 4B, lower widths of portions of the plurality of word lines WL3, which are arranged over the device isolation film 104, may be greater than widths of portions of the plurality of word lines WL3, which are arranged over the active regions AC. Therefore, the resistance of the plurality of word lines WL3 may be reduced. For example, spaces occupied by those portions of the plurality of word lines WL3 located over the device isolation film 104 may be enlarged, resulting in an increase in the volume of the plurality of word lines WL3. Therefore, the resistance of the plurality of word lines WL3 may be reduced. In addition, the integrated circuit device 300 includes the first impurity region DA3 and the second impurity region DB3, which have excess oxygen (O) and contact the gate dielectric film 120, whereby, at an interface between the gate dielectric film 120 and the first impurity region DA3, at an interface between the gate dielectric film 120 and the second impurity region DB3, and in the gate dielectric film 120, Vo's may be extinguished or the density of Vo's may be significantly reduced by the excess oxygen (O) supplied by the first impurity region DA3 and the second impurity region DB3. Therefore, in a transistor including the gate dielectric film 120, the threshold voltage may be precisely controlled and stable electrical characteristics may be secured.

Figure 5A:
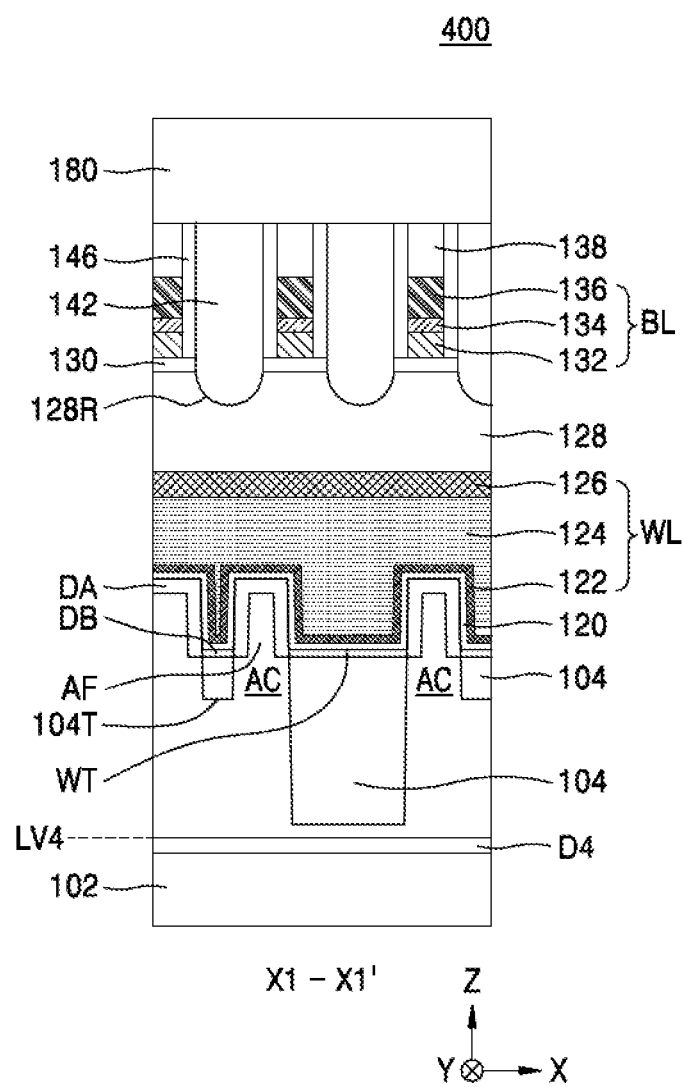
FIGS. 5A and 5B are diagrams illustrating an integrated circuit device according to an exemplary embodiment of the present inventive concept, and in particular.
Figure 5B:
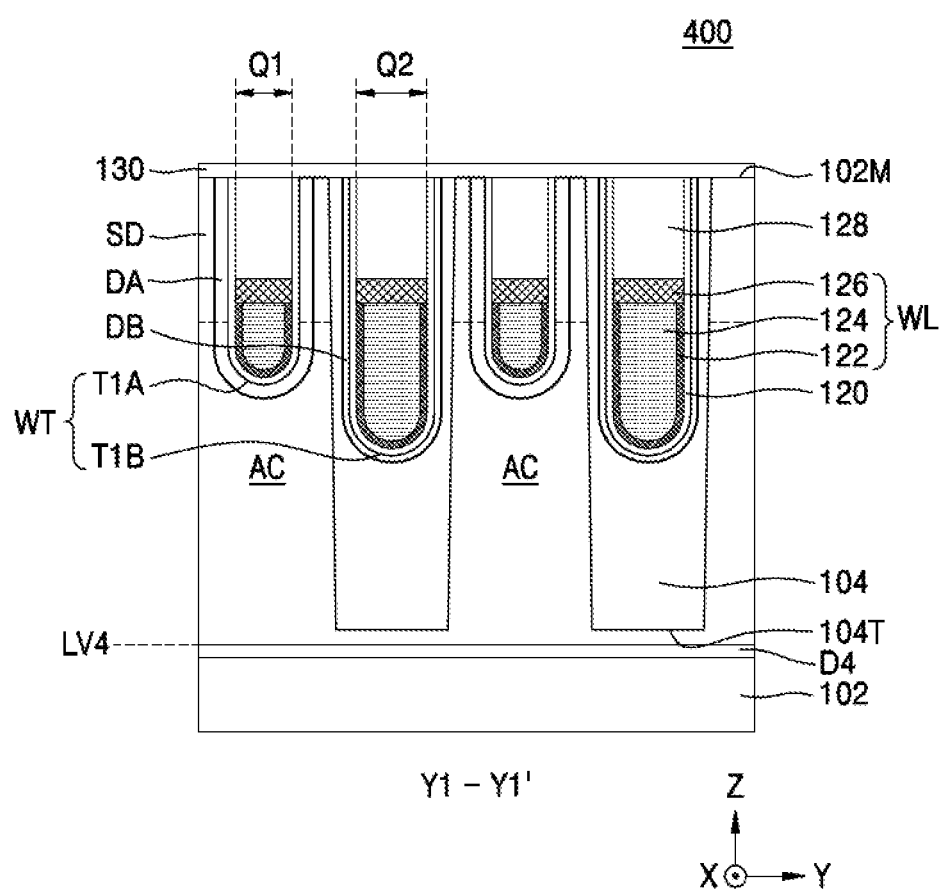

FIGS. 5A and 5B are diagrams illustrating an integrated circuit device according to an exemplary embodiment of the present inventive concept, and in particular, FIG. 5A is a cross-sectional view of a region corresponding to the cross-section taken along line X1-X1' of FIG. 1, and FIG. 4B is a cross-sectional view illustrating some components in a region corresponding to the cross-section taken along line Y1-Y1' of FIG. 1. In FIGS. 5A and 5B, the reference numerals the same as those in FIGS. 2A to 2D respectively denote the same members, and repeated descriptions thereof will be omitted.

Referring to FIGS. 5A and 5B, an integrated circuit device 400 has a configuration substantially identical to that of the integrated circuit device 100 described with reference to FIGS. 2A to 2D. The integrated circuit device 400 may have the planar layout configuration shown in FIGS. 1 and 2D. However, the integrated circuit device 400 further includes an impurity region D4 having a flat plate shape and extending, in the substrate 102, parallel to the main surface 102M of the substrate 102. The impurity region D4 may include interstitial atoms including, for example, oxygen (O) atoms, silicon (Si) atoms, helium (He) atoms, argon (Ar) atoms, fluorine (F) atoms, or a combination thereof. A more detailed configuration of the impurity region D4 is substantially the same as that described regarding the first impurity region DA shown in FIGS. 2A, 2C, and 2D.

Although FIGS. 5A and 5B illustrate an example in which the impurity region D4 extends in a flat plate shape at a level LV4 that is lower than a level of a lowest surface of the device isolation film 104, the present inventive concept is not limited thereto. For example, the impurity region D4 may extend parallel to the main surface 102M of the substrate 102, in a flat plate shape crossing the substrate 102 and the device isolation film 104, at a level that is lower than the level of the lowest surface of the word line trench WT and higher than the level of the lowest surface of the device isolation film 104.

The impurity region D4 may include interstitial atoms including, for example, oxygen (O) ions, silicon (Si) ions, helium (He) ions, argon (Ar) ions, fluorine (F) ions, or a combination thereof. The interstitial atoms included in the impurity region D4 may cause interstitial oxygen (O) or excess oxygen (O) in and around the impurity region D4. The interstitial oxygen (O) or the excess oxygen (O) generated as such may move into the gate dielectric film 120 and to a surface thereof via various paths. Thus, before Vo's in the gate dielectric film 120 and at the surface thereof capture hydrogen, the Vo's may be extinguished or the density of Vo's may be significantly reduced, due to the interstitial oxygen (O) or the excess oxygen (O), and thus, the inside of the gate dielectric film 120 and the interface between the substrate 102 and the gate dielectric film 120 may be in a stable state. Therefore, in a transistor including the gate dielectric film 120, the threshold voltage may be precisely controlled and stable electrical characteristics may be secured.

In an exemplary embodiment of the present inventive concept, each of the integrated circuit device 200 shown in FIGS. 3A and 3B and the integrated circuit device 300 shown in FIGS. 4A and 4B may also further include the impurity region D4 described with reference to FIGS. 5A and 5B.

FIGS. 6A to 6H illustrate cross-sectional views illustrating sequential processes of a method of manufacturing an integrated circuit device, according to an exemplary embodiment of the present inventive concept. An example method of manufacturing the integrated circuit device 100 shown in FIGS. 1 and 2A to 2D will be described with reference to FIGS. 6A to 6H. FIGS. 6A to 6H each illustrates cross-sectional configurations corresponding to the cross-section taken along line X1-X1' of FIG. 1 and the cross-section taken along line Y1-Y1' of FIG. 1, according to a process sequence.

Figure 6A:
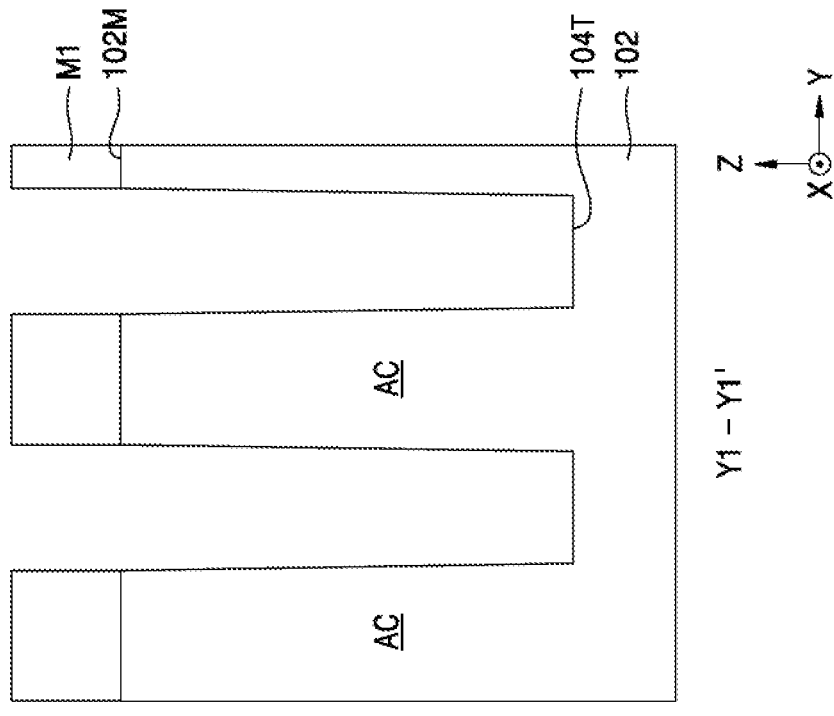
FIGS. 6A to 6H illustrate cross-sectional views illustrating sequential processes of a method of manufacturing an integrated circuit device, according to an exemplary embodiment of the present inventive concept.
Figure 6A:
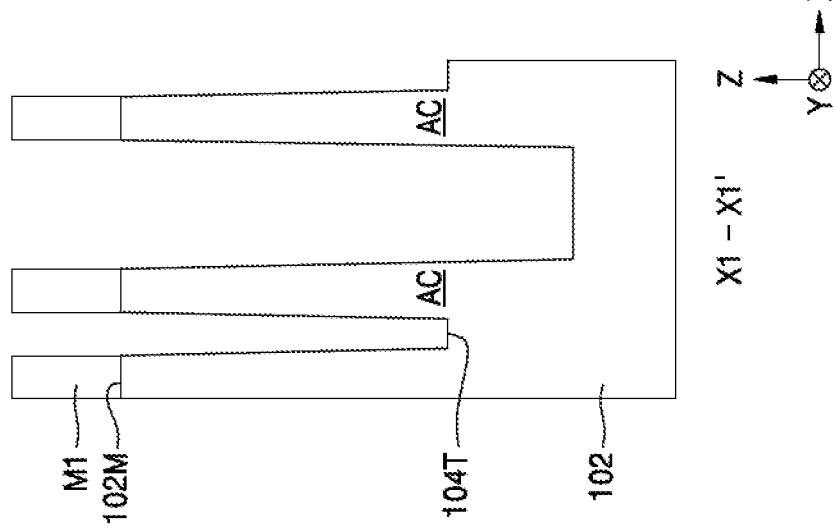

Referring to FIG. 6A, a mask pattern M1 is formed on the main surface 102M of the substrate 102, and the device isolation trench 104T is formed in the substrate 102 by etching the substrate 102 using the mask pattern M1 as an etch mask. The mask pattern M1 may be formed by a photolithography process and an etching process. The plurality of active regions AC may be defined to be apart from each other in the substrate 102 by the device isolation trench 104T. The mask pattern M1 may include a hardmask including, for example, an oxide film, polysilicon, or a combination thereof. In an exemplary embodiment of the present inventive concept, the device isolation trench 104T may be formed by removing an upper portion of the substrate 102 through an anisotropic etching process using the mask pattern M1 as an etch mask.

Figure 6B:
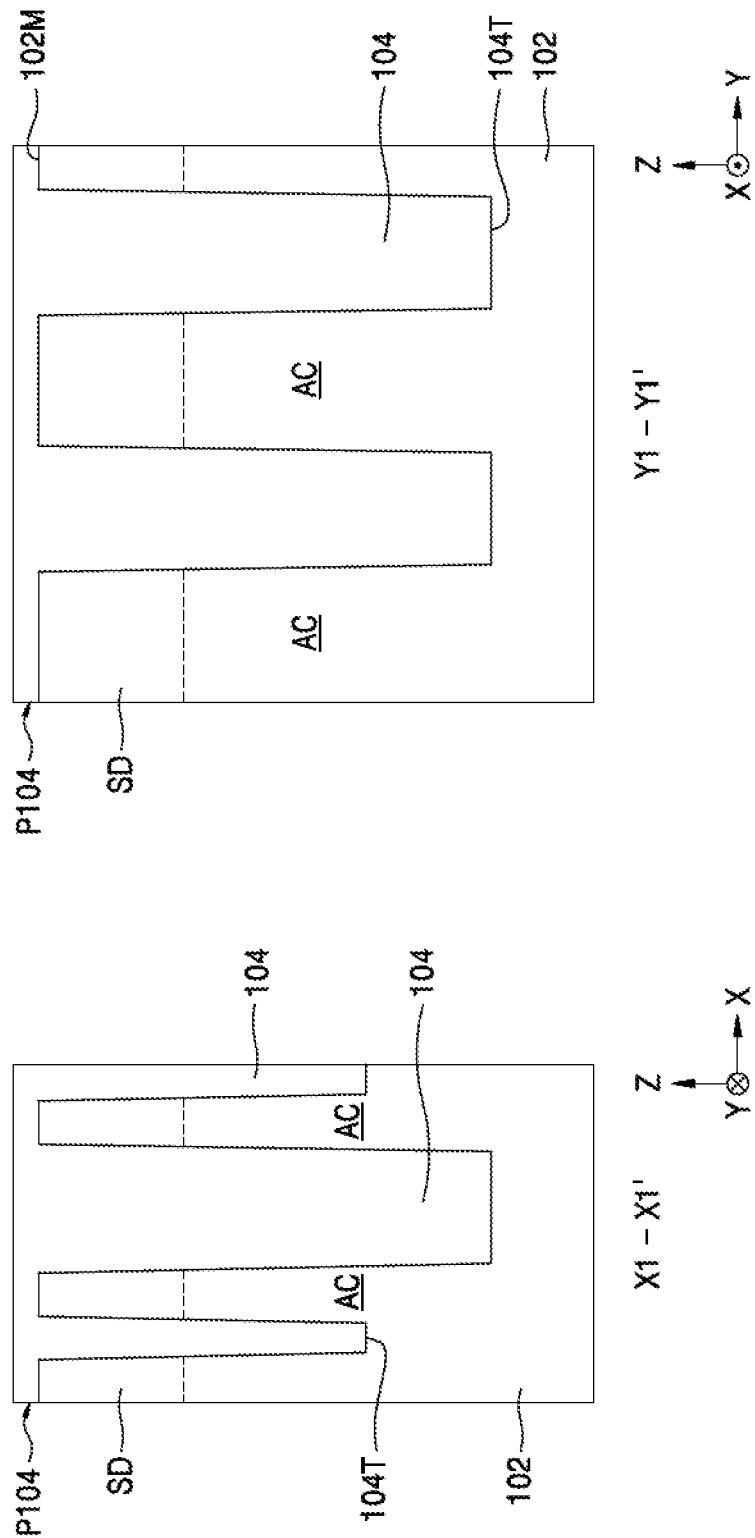

Referring to FIG. 6B, after the mask pattern M1 is removed from a result product of FIG. 6A, an insulating film P104 is formed to fill the device isolation trench 104T and cover the main surface 102M of the substrate 102, and an ion implantation process for forming the plurality of source/drain regions SD in the substrate 102 is performed. In the ion implantation process for forming the plurality of source/drain regions SD, the ions are implanted into the substrate 102 at a desired energy and dose. The ion used in the ion implantation process here may include a p-type dopant and/or an n-type dopant. Suitable n-type dopants may include, for example, phosphorous (P), arsenic (As), antimony (Sb), bismuth (Bi), and combinations thereof. Suitable p-type dopants may include, for example, boron (B), aluminum (Al), gallium (Ga), thallium (Tl), indium (In), and combinations thereof. In an exemplary embodiment of the present inventive concept, to form the plurality of source/drain regions SD, heat treatment may be performed after the p-type dopants and/or the n-type dopants are implanted into the substrate 102 to enhance the diffusion of the implanted dopants in the substrate 102. A portion of the insulating film P104, which fills the device isolation trench 104T, may be the device isolation film 104. A portion of the insulating film P104, which covers the main surface 102M of the substrate 102, may protect the main surface 102M of the substrate 102 during the ion implantation process for forming the plurality of source/drain regions SD or during a subsequent etching process.

Figure 6C:
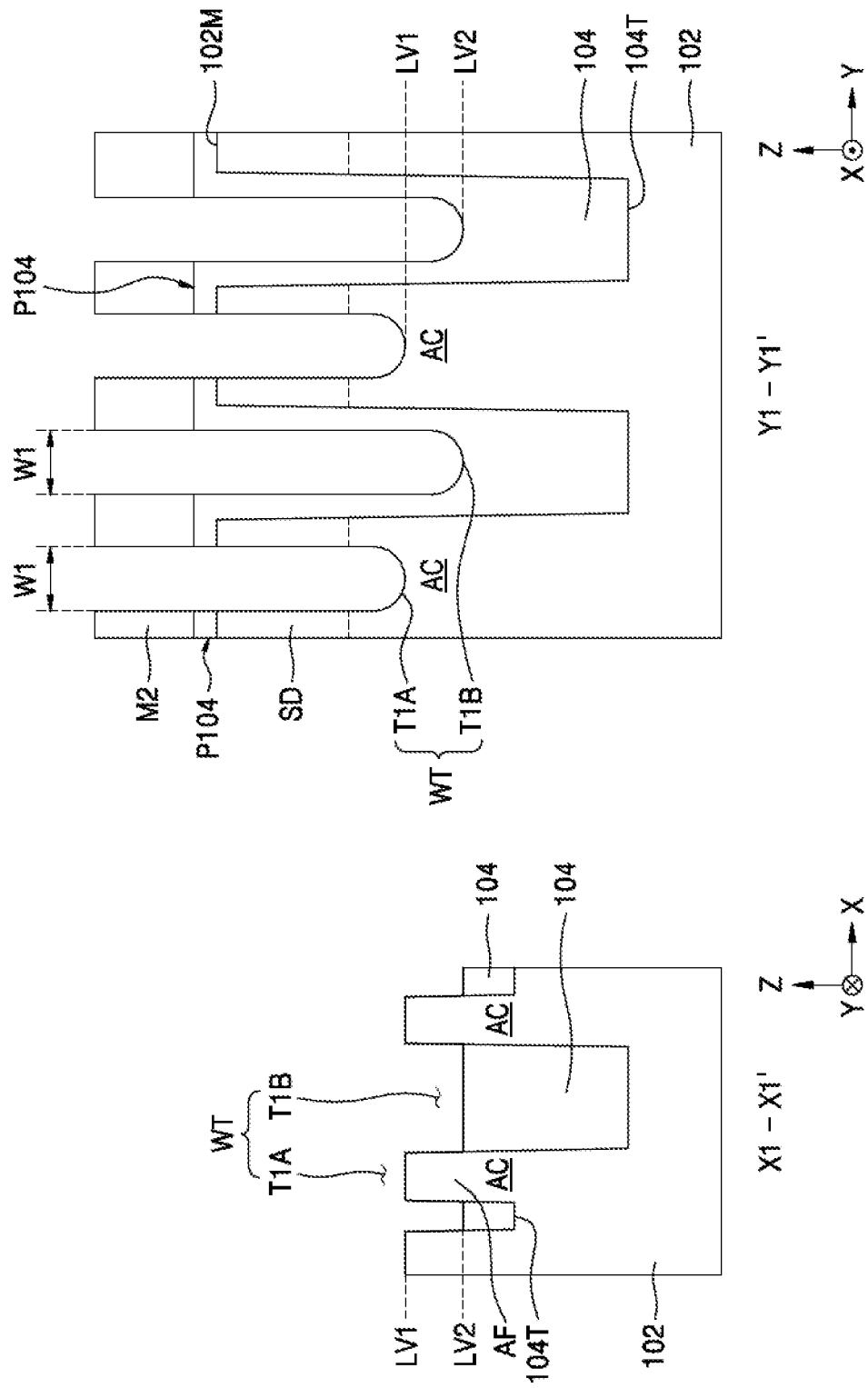

Referring to FIG. 6C, both the insulating film P104 and the substrate 102 are partially etched by using a mask pattern M2 as an etch mask, thereby forming the plurality of word line trenches WT, which extend in the first horizontal direction (X direction) across the plurality of active regions AC and the device isolation film 104. The word line trench WT may include the first trench portion T1A, which has a bottom surface exposing the substrate 102 at the first level LV1, and the second trench portion T1B, which has a bottom surface exposing the device isolation film 104 at the second level LV2 that is lower than the first level LV1. The mask pattern M2 may include, for example, an oxide film, an amorphous carbon layer (ACL), a silicon oxynitride (SiON) film, or a combination thereof. The mask pattern M2 may be formed by a photolithography process and an etching process.

To form the plurality of word line trenches WT, a first etching process, in which the substrate 102 and the device isolation film 104 are etched from the main surface 102M of the substrate 102 under the condition that an etch rate of the substrate 102 is approximately equal to an etch rate of the device isolation film 104, and a second etching process, in which the substrate 102 and the device isolation film 104 are etched under the condition that the etch rate of the device isolation film 104 is greater than the etch rate of the substrate 102, may be sequentially performed in this stated order. In an exemplary embodiment of the present inventive concept, the plurality of word line trenches WT may be formed by removing an upper portion of the substrate 102 and an upper portion of the device isolation film 104 through an anisotropic etching process. As a result, the second level LV2 of the bottom surface of the second trench portion T1B, which exposes the device isolation film 104, may be lower than the first level LV1 of the bottom surface of the first trench portion T1A, which exposes the substrate 102. The first trench portion T1A and the second trench portion T1B may respectively have widths W1 that are substantially equal to or approximately similar to each other, in the second horizontal direction (Y direction).

The plurality of active regions AC may include a plurality of fin areas AF protruding upwards in the vertical direction (Z direction) from the second level LV2 to the first level LV1 in the plurality of word line trenches WT.

Figure 6D:
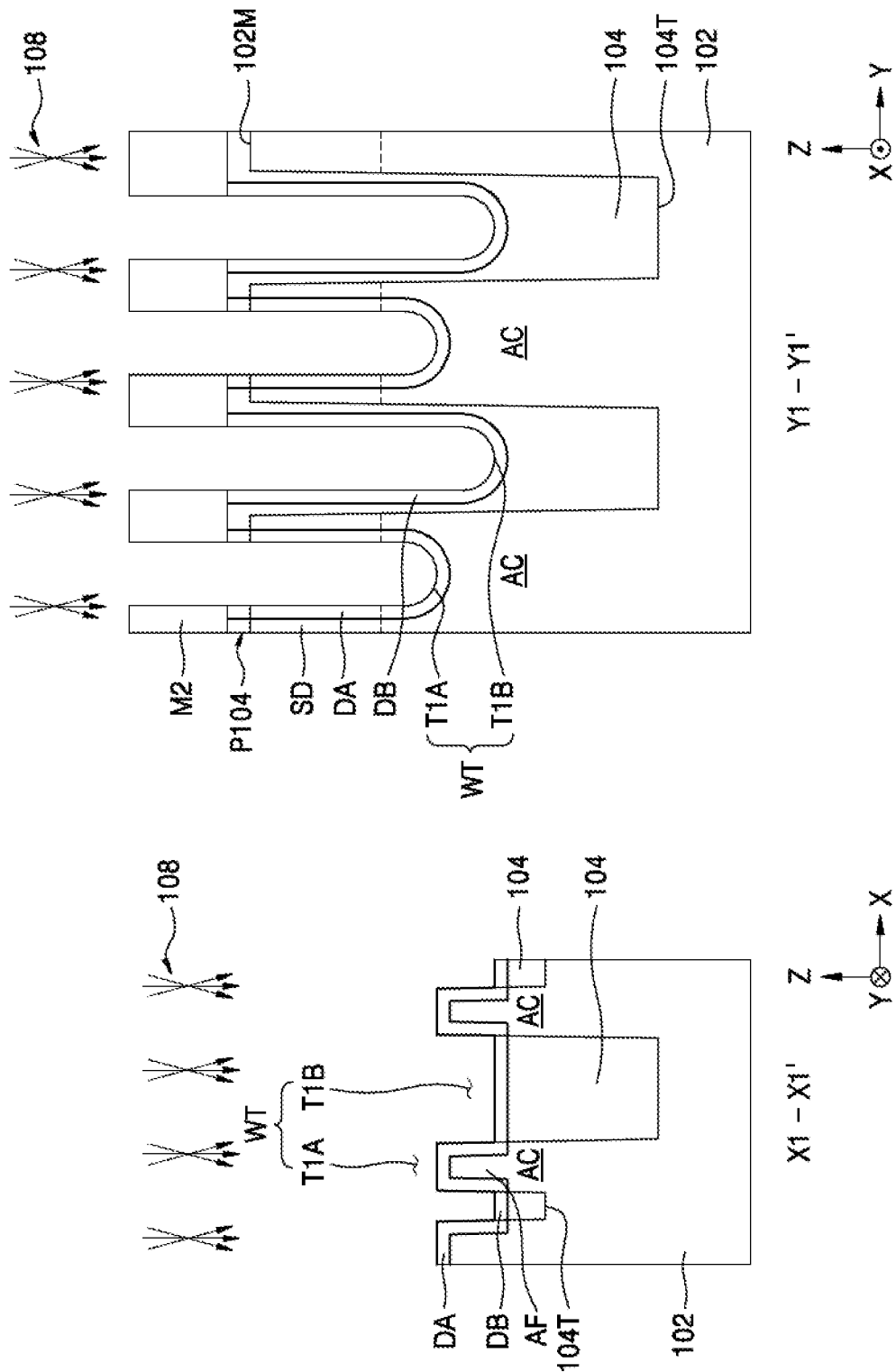

Referring to FIG. 6D, dopant ions 108 are implanted into the substrate 102 and the device isolation film 104 through the plurality of word line trenches WT, thereby forming the first impurity region DA in the substrate 102 to surround the first trench portion T1A and forming the second impurity region DB in the device isolation film 104 to surround the second trench portion T1B.

In an exemplary embodiment of the present inventive concept, the dopant ions 108 may include, for example, oxygen (O) ions, silicon (Si) ions, helium (He) ions, argon (Ar) ions, fluorine (F) ions, or a combination thereof.

In an exemplary embodiment of the present inventive concept, to implant the dopant ions 108 into the substrate 102 and the device isolation film 104, a plasma-type ion implantation device may be used. When the plasma-type ion implantation device is used, a process of implanting the dopant ions 108 may be performed at an acceleration voltage in a range from about 0.1 keV to about 50 keV, and a dose may be selected from a range of about $1×10^{13}$ ions/cm$^2$ to about $1×10^{15}$ ions/cm$^2$.

An implantation angle of the dopant ions 108 may be selected from a range of about 0 degrees to about 3 degrees relative to a normal direction to the main surface 102M of the substrate 102, and the ion implantation process may be performed while a rotation angle is cyclically changed by as many as about 45, 90, 135, or 180 degrees relative to a notch or an orientation flat of the substrate 102 in a direction parallel to the main surface 102M of the substrate 102.

In an exemplary embodiment of the present inventive concept, to form the first impurity region DA and the second impurity region DB, heat treatment may be performed after the dopant ions 108 are implanted into the substrate 102 and the device isolation film 104. In an exemplary embodiment of the present inventive concept, directly after the dopant ions 108 are implanted into the substrate 102 and the device isolation film 104, a heat treatment process for diffusing the dopant ions 108 may be omitted and a subsequent process may be performed. In this case, the dopant ions 108 implanted into the substrate 102 and the device isolation film 104 may be diffused due to an atmosphere temperature during a process of forming the gate dielectric film 120, which is described below with reference to FIG. 6F, whereby the first impurity region DA and the second impurity region DB may be formed. For example, the dopant ions 108 may be implanted into the substrate 102 including a crystalline semiconductor, whereby the dopant ions 108 implanted portion of the substrate 102 may be amorphized to form the first impurity region DA including an amorphous semiconductor layer which may include interstitial atoms including, for example, oxygen (O) atoms, silicon (Si) atoms, helium (He) atoms, argon (Ar) atoms, or fluorine (F) atoms derived from the dopant ions 108 implanted into the substrate 102. Therefore, unlike the substrate 102, the first impurity region DA may have an amorphous structure. For example, when the substrate 102 includes crystalline silicon and the dopant ions 108 included in the first impurity region DA include oxygen (O) ions, the first impurity region DA may include an amorphous silicon layer, and oxygen (O) atoms derived from the dopant ions 108 may be present as interstitial oxygen (O) in the first impurity region DA.

Because the dopant ions 108 are implanted into the device isolation film 104, a crystal structure of a material constituting the device isolation film 104 may be disrupted due to bombardment caused by the dopant ions 108 in the device isolation film 104. Thus, the second impurity region DB, which is in the device isolation film 104 and surrounds the second trench portion T1B, may include interstitial atoms and interstitial oxygen (O), the interstitial atoms including, for example, oxygen (O) atoms, silicon (Si) atoms, helium (He) atoms, argon (Ar) atoms, or fluorine (F) atoms derived from the dopant ions 108 implanted into the device isolation film 104, and the interstitial oxygen (O) being derived from an insulating film, for example, a silicon oxide ($SiO_2$) film, constituting the device isolation film 104. Therefore, unlike the device isolation film 104, the second impurity region DB may have a damaged lattice structure.

Figure 6E:
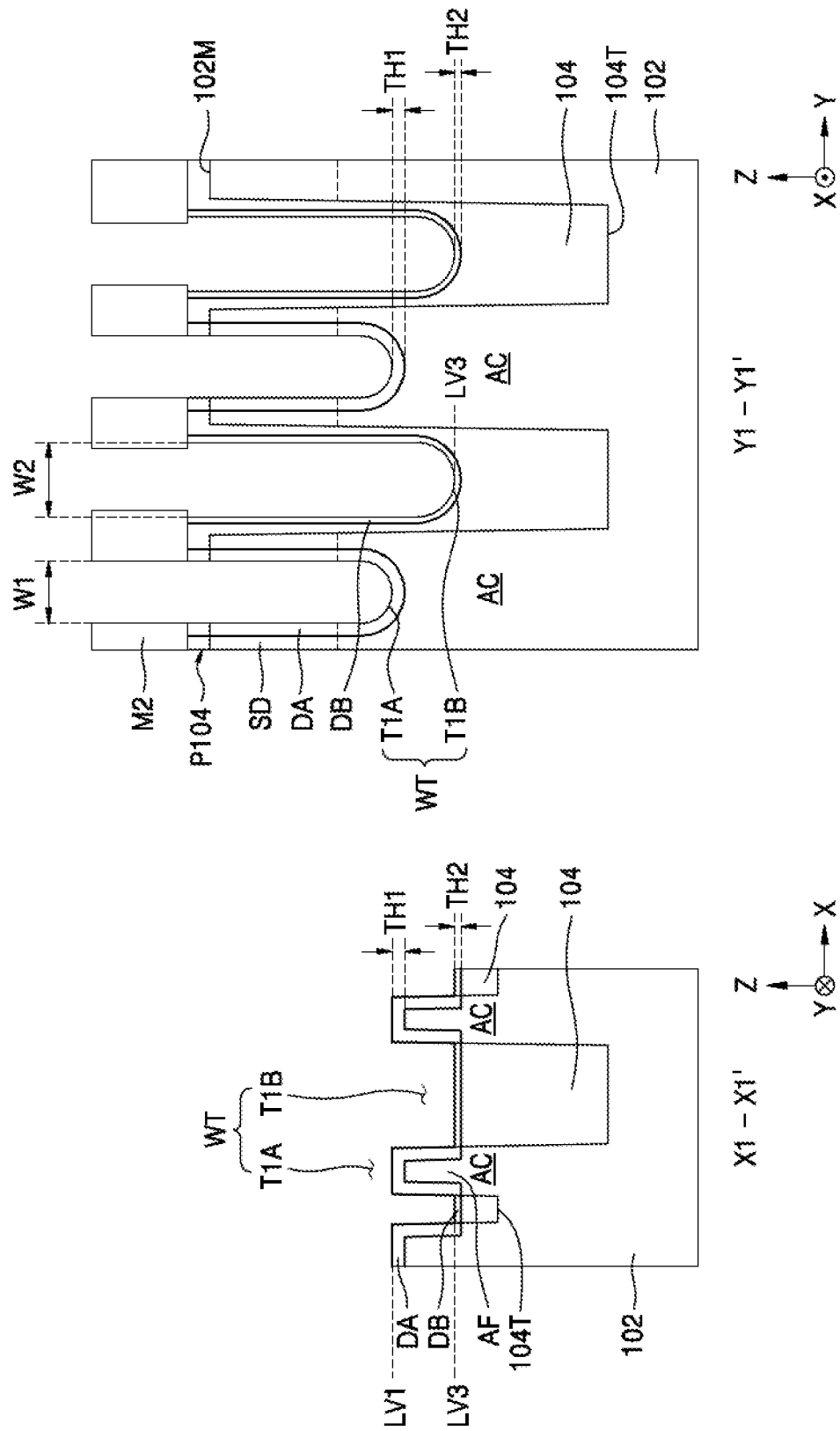

Referring to FIG. 6E, unintended native oxide films and contaminants are removed from a result product of FIG. 6D by cleaning the result product of FIG. 6D in a first etching atmosphere, and a portion of the second impurity region DB exposed by the second trench portion T1B is removed.

In an exemplary embodiment of the present inventive concept, the first etching atmosphere may be a wet etching atmosphere using diluted hydrofluoric acid (HF) (DHF) and ozone ($O_3$). After the result product of FIG. 6D is cleaned with the first etching atmosphere, an obtained result product may be dried by supplying isopropyl alcohol (IPA) and/or nitrogen ($N_2$) gas to the obtained result product. For example, when the substrate 102 includes silicon (Si) and the device isolation film 104 includes silicon oxide ($SiO_2$), the high etch selectivity of silicon oxide ($SiO_2$) vs. silicon (Si) under the wet etching atmosphere using DHF and $O_3$ would render a significant film loss of second impurity region DB, which includes silicon oxide, and no or very little film loss of the first impurity region DA, which includes silicon (Si) after the result product of FIG. 6D is cleaned in the first etching atmosphere.

Because the second impurity region DB has a damaged lattice structure, the second impurity region DB may be prone to be removed by the first etching atmosphere when the result product of FIG. 6D is cleaned with the first etching atmosphere. Thus, when the result product of FIG. 6D is cleaned with the first etching atmosphere, the second impurity region DB exposed by the second trench portion T1B may be removed by as much as a portion of the thickness thereof from an exposed surface thereof, whereby the thickness of the second impurity region DB exposed by the second trench portion T1B may be reduced and the width and depth of the second trench portion T1B may increase. For example, reducing the thickness of the second impurity region DB exposed by the second trench portion T1B may be performed in the wet etching atmosphere. After the cleaning process in the first etching atmosphere, a width W2 of the second trench portion T1B may be greater than a width W1 of the first trench portion T1A in the second horizontal direction (Y direction), and the level of the lowest surface of the second trench portion T1B may be the third level LV3 that is lower than the second level LV2 (FIG. 6C).

After the cleaning process in the first etching atmosphere, the second thickness TH2 of the second impurity region DB may be smaller than the first thickness TH1 of the first impurity region DA.

In addition, during the cleaning process in the first etching atmosphere, the second impurity region DB on a portion of the device isolation film 104, which has a relatively small horizontal width, may also be removed by as much as a portion of the thickness thereof from the exposed surface thereof, whereby a horizontal width and a vertical length of the second trench portion T1B may increase. Thus, two second trench portions T1B, which are arranged on both sides of a fin area AF of the substrate 102 in the second horizontal direction (Y direction) with the fin area AF interposed therebetween, may have no or an extremely small difference in depth therebetween. As a result, after the word line WL is formed as described below with reference to FIG. 6G, the word line WL covering the fin area AF may have no or an extremely small difference in height between portions thereof on both sides of the fin area AF in the second horizontal direction (Y direction). Therefore, in a transistor including the word line WL covering the fin area AF, gate controllability may be enhanced.

Figure 6F:
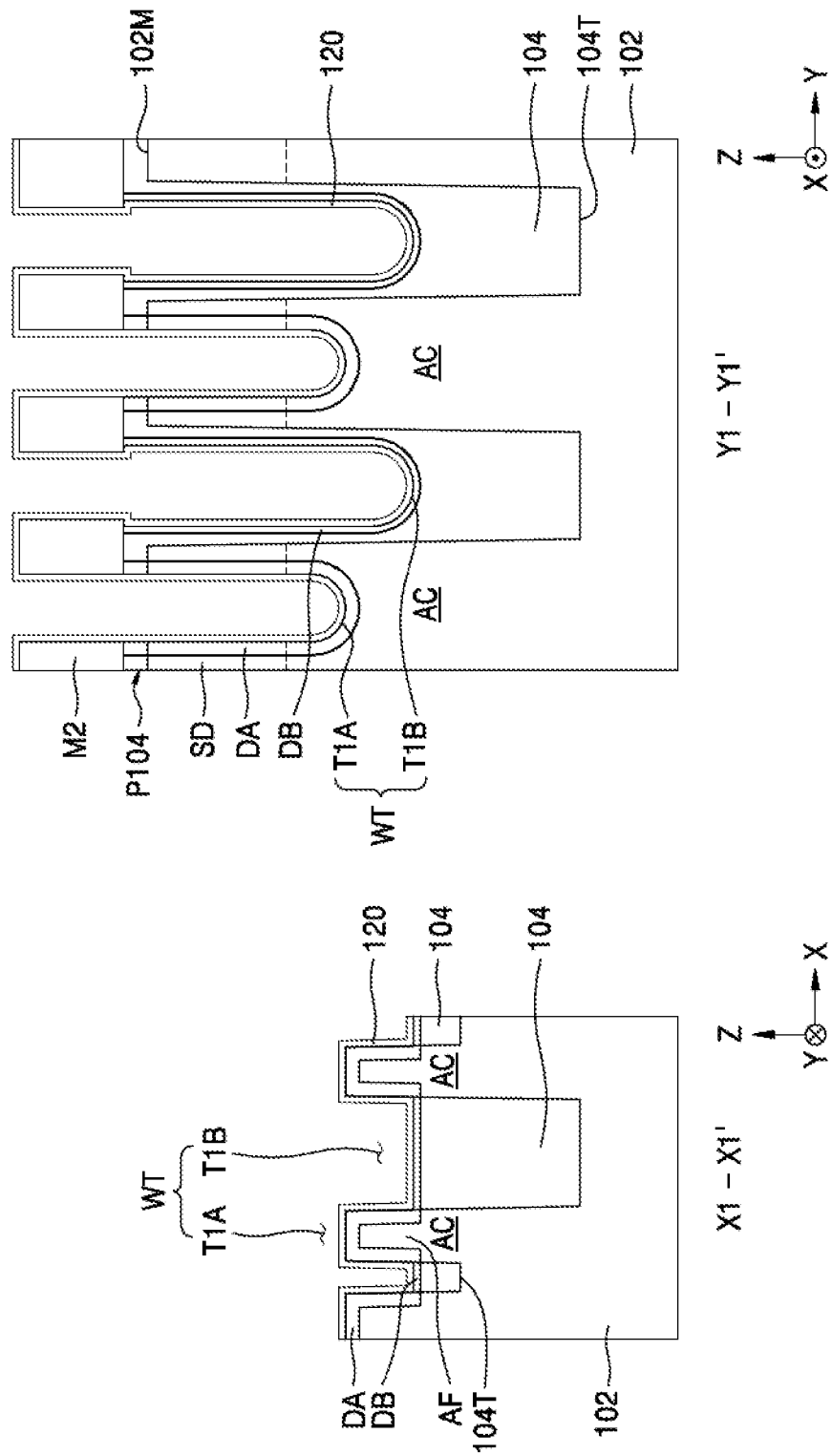

Referring to FIG. 6F, the gate dielectric film 120 is formed on the result product of FIG. 6E. The gate dielectric film 120 may be formed to conformally cover the first impurity region DA and the second impurity region DB.

To form the gate dielectric film 120, an atomic layer deposition (ALD) process may be used. In an exemplary embodiment of the present inventive concept, a process of forming the gate dielectric film 120 may be performed in a plasma atmosphere by using $O_2$ gas and an inert gas as plasma processing gases. In an exemplary embodiment of the present inventive concept, the process of forming the gate dielectric film 120 may be performed in a plasma atmosphere by using $O_2$ gas, an inert gas, and $H_2$ gas as plasma processing gases. In an exemplary embodiment of the present inventive concept, during the formation of the gate dielectric film 120, an in-situ steam generation (ISSG) process using water vapor or a combination of $O_2$ gas and $H_2$ gas may be performed.

In an exemplary embodiment of the present inventive concept, to form the plasma atmosphere, $O_2$ gas and Ar gas may be supplied into a plasma processing apparatus. In an exemplary embodiment of the present inventive concept, to form the plasma atmosphere, $O_2$ gas, Ar gas, and $H_2$ gas may be supplied into the plasma processing apparatus. By controlling an amount of oxygen (O) ions or oxygen (O) radicals in the plasma atmosphere, the gate dielectric film 120 may be formed to a uniform thickness on both a surface of the first impurity region DA exposed by the first trench portion T1A and a surface of the second impurity region DB exposed by the second trench portion T1B.

The process of forming the gate dielectric film 120 may be performed by using, for example, a radial line slot antenna (RLSA) microwave plasma processing device, a remote plasma type plasma processing device, an inductively coupled plasma (ICP) type plasma processing device, an electron cyclotron resonance (ECR) plasma type plasma processing device, a surface reflection wave plasma type plasma processing device, a magnetron plasma type plasma processing device, or the like. The gate dielectric film 120 may have a thickness in a range from about 10 Å to about 40 Å, but the present inventive concept is not limited thereto.

The process of forming the gate dielectric film 120 may be performed in an atmosphere of a relatively high temperature in a range from about 600° C. to about 1000° C. Thus, during the formation of the gate dielectric film 120, interstitial oxygen (O) in the first impurity region DA and the second impurity region DB may move to the interface between the gate dielectric film 120 and the first impurity region DA, to the interface between the gate dielectric film 120 and the second impurity region DB, and into the gate dielectric film 120, and thus, excess oxygen (O) may be supplied to the interfaces set forth above and into the gate dielectric film 120. As a result, at the interfaces set forth above and in the gate dielectric film 120, Vo's are filled with oxygen (O) and are in a stable state, whereby the Vo's may be extinguished or the density of Vo's may be significantly reduced. Therefore, in a transistor including the gate dielectric film 120, the threshold voltage may be precisely controlled and stable electrical characteristics may be secured. The gate dielectric film 120 may include, for example, a silicon oxide ($SiO_2$) film substantially free from a Vo, a metal oxide film substantially free from a Vo, an oxygen-rich silicon oxide film, or an oxygen-rich metal oxide film.

Figure 6G:
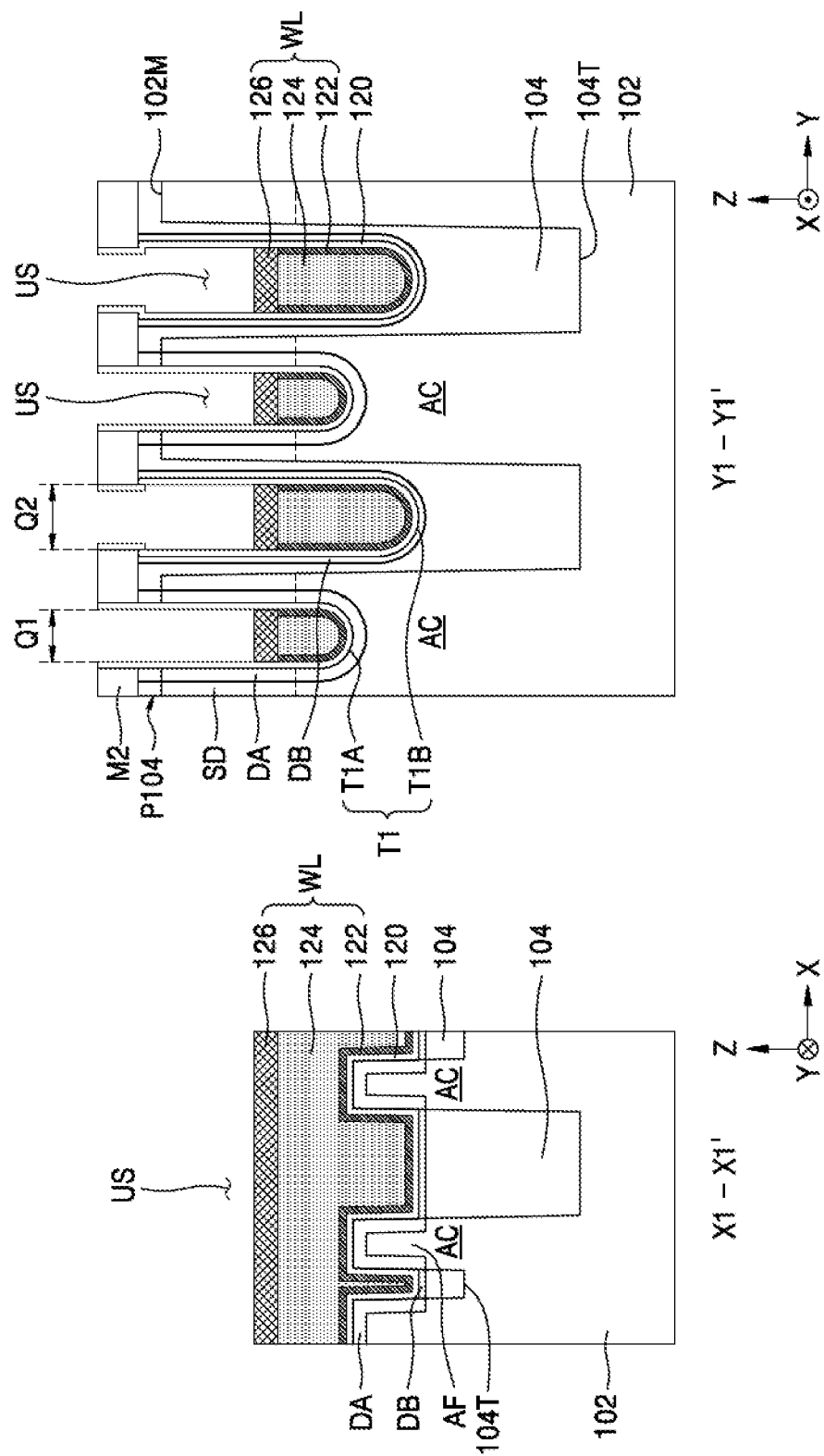

Referring to FIG. 6G, the plurality of word lines WL are formed on the gate dielectric film 120 to partially fill each of the first trench portion T1A and the second trench portion T1B.

In an exemplary embodiment of the present inventive concept, to form the plurality of word lines WL, the metal-containing barrier film 122, which conformally covers an exposed surface of the gate dielectric film 120 in the first trench portion T1A and the second trench portion T1B, and the lower word line 124, which is arranged on the metal-containing barrier film 122 to fill the first trench portion T1A and the second trench portion T1B, may be formed first, and then, unnecessary portions of the metal-containing barrier film 122 and the lower word line 124 may be removed by etchback such that only portions of the metal-containing barrier film 122 and the lower word line 124, which partially fill each of the first trench portion T1A and the second trench portion T1B, remain. Next, a conductive layer for forming the upper word line 126 may be formed to cover the metal-containing barrier film 122 and the lower word line 124 in the first trench portion T1A and the second trench portion T1B, followed by removing, by etchback, unnecessary portions of the conductive layer for forming the upper word line 126 such that an upper space of each of the first trench portion T1A and the second trench portion T1B is emptied, thereby leaving the upper word line 126 in the conductive layer for forming the upper word line 126. A portion of the conductive layer for forming the upper word line 126 in the first trench portion T1A and the second trench portion T1B may be simultaneously removed during the etchback process. Accordingly, the upper surface of the upper word line 126 within the device isolation film 104 and the upper surface of the upper word line 126 within the substrate 102 may be positioned at substantially the same level. Thus, the metal-containing barrier film 122 may contact the gate dielectric film 120, and the lower word line 124 may be surrounded by the metal-containing barrier film 122 and the upper word line 126 in each of the first trench portion T1A and the second trench portion T1B. During the formation of the upper word line 126, each of the mask pattern M2, which covers the main surface 102M of the substrate 102, and the gate dielectric film 120 may be partially consumed and thus have a reduced thickness.

In the second horizontal direction (Y direction), a portion of each of the plurality of word lines WL, which fills the first trench portion T1A, may have the first width Q1, and a portion of each of the plurality of word lines WL, which fills the second trench portion T1B, may have the second width Q2 that is greater than the first width Q1 set forth above. After the plurality of word lines WL are formed, an upper trench space US may remain above each of the plurality of word lines WL in the word line trench WT.

Figure 6H:
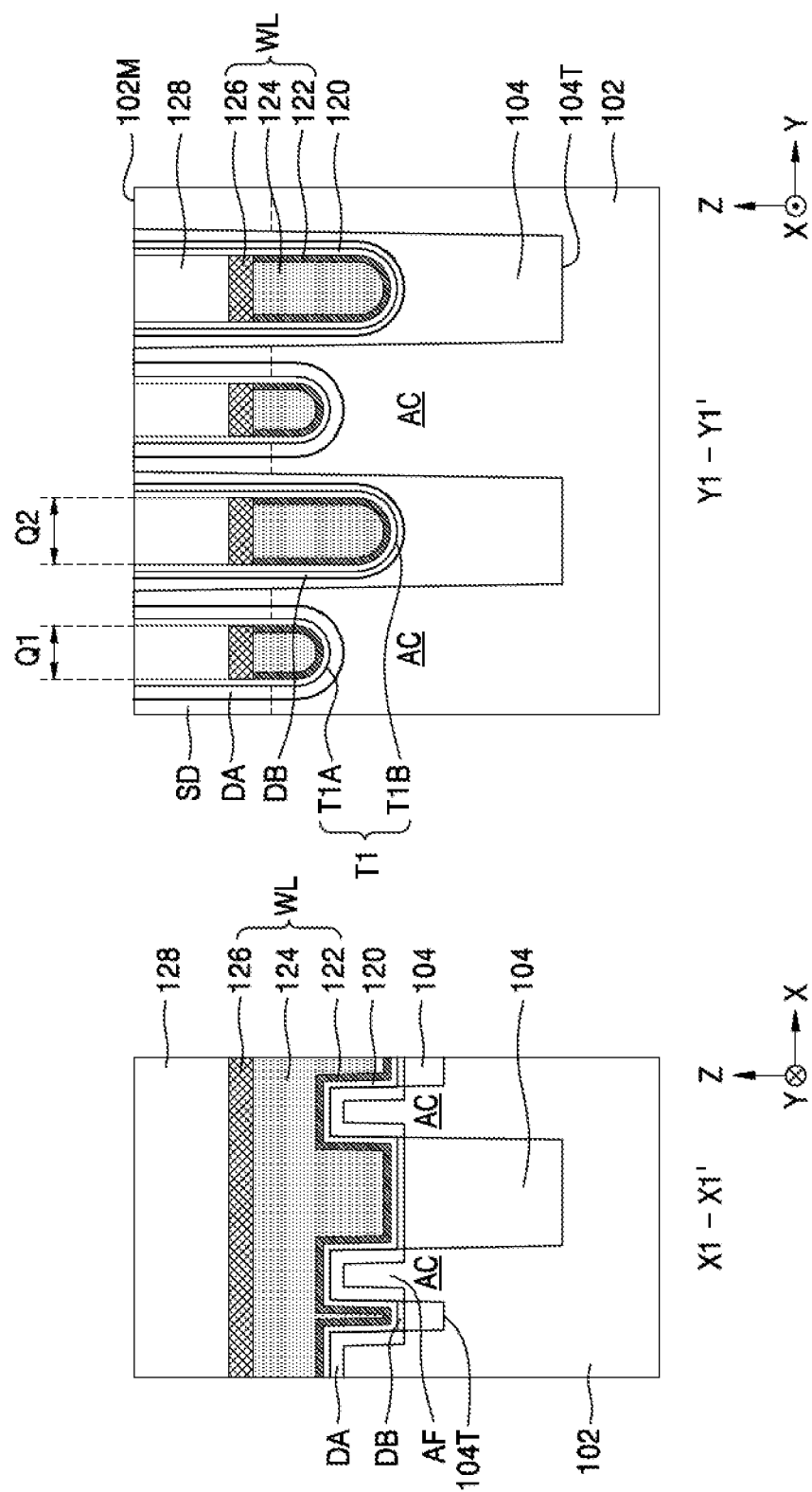

Referring to FIG. 6H, the buried insulating film 128 is formed on a result product of FIG. 6G to fill the upper trench space US, followed by removing unnecessary films or layers on the substrate 102, thereby exposing the main surface 102M of the substrate 102.

In the process described with reference to FIGS. 6A to 6H, although the processes of FIGS. 6D to 6G are described as being performed while the mask pattern M2 remains over the substrate 102, the mask pattern M2 may be removed in one of the processes of FIGS. 6D to 6G, as needed, and then, a subsequent process may be performed.

Next, the buffer insulating film 130, the plurality of direct contacts DC, the plurality of bit lines BL, the plurality of insulating spacers 146, the plurality of insulating fences 142, the plurality of conductive plugs 140P, the metal silicide film 172, the conductive landing pad LP, and the insulating film 180 may be formed on or over the substrate 102, thereby manufacturing the integrated circuit device 100, which has the configuration shown in FIGS. 2A to 2D.

To manufacture the integrated circuit device 200 described with reference to FIGS. 3A and 3B, the method described with reference to FIGS. 6A to 6H may be used. However, instead of the device isolation film 104 described with reference to FIG. 6B, the device isolation film 204 may be formed. To form the device isolation film 204, the mask pattern M1 is removed from the result product of FIG. 6A, followed by forming the insulating liner 204A to conformally cover an inner wall of the device isolation trench 104T and the main surface 102M of the substrate 102, and then, the gap-fill insulating film 204B may be formed, on the insulating liner 204A, to a thickness sufficient to fill the remaining space of the device isolation trench 104T. An ion implantation process for forming the plurality of source/drain regions SD in the substrate 102 may then be performed. Next, the processes described with reference to FIGS. 6C to 6H may be performed, and then, the buffer insulating film 130, the plurality of direct contacts DC, the plurality of bit lines BL, the plurality of insulating spacers 146, the plurality of insulating fences 142, the plurality of conductive plugs 140P, the metal silicide film 172, the conductive landing pad LP, and the insulating film 180 may be formed on or over the substrate 102, thereby manufacturing the integrated circuit device 200 described with reference to FIGS. 3A and 3B.

Figure 7A:
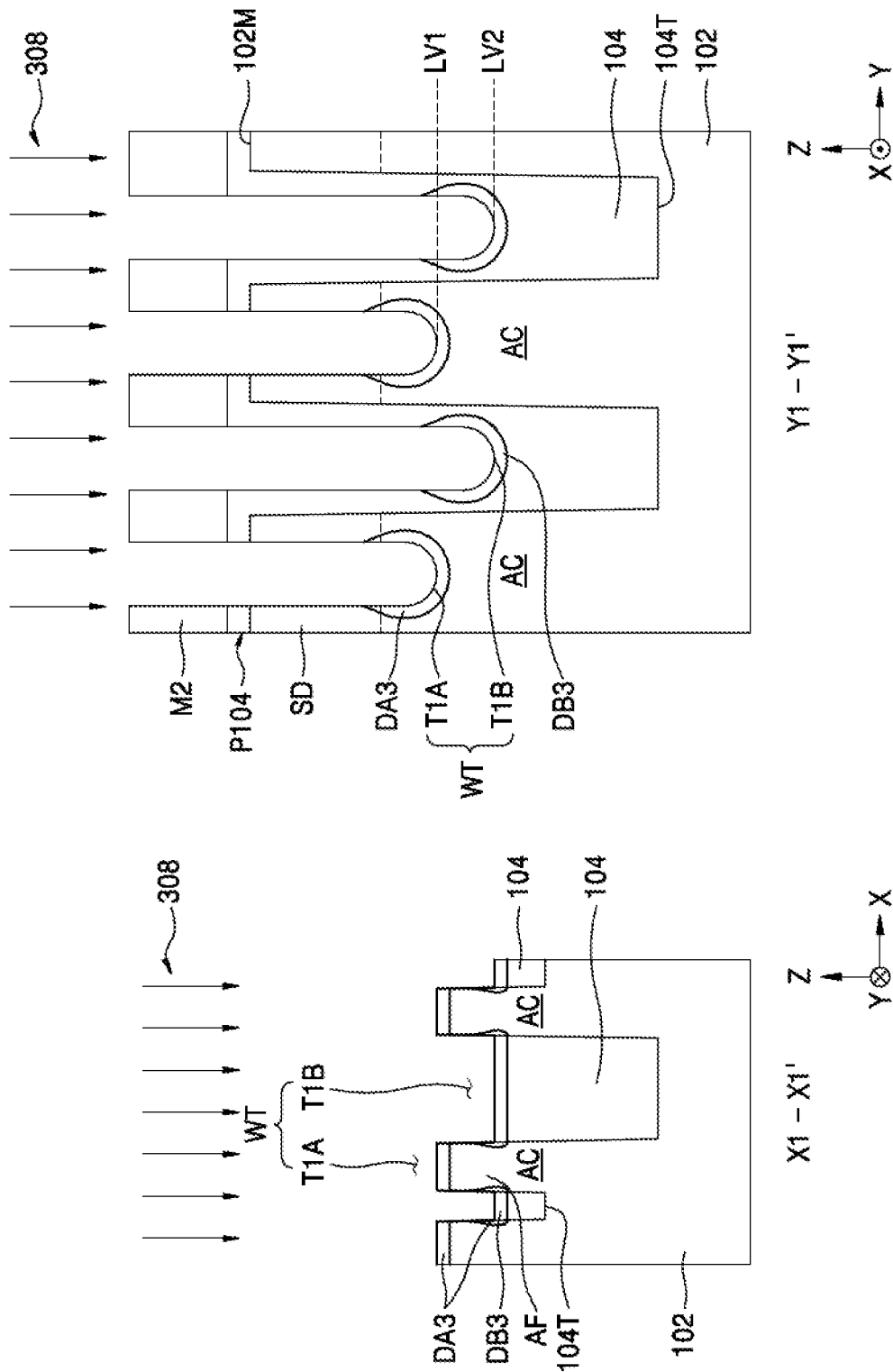
FIGS. 7A to 7C illustrate cross-sectional views illustrating sequential processes of a method of manufacturing an integrated circuit device, according to an exemplary embodiment of the present inventive concept.
Figure 7B:
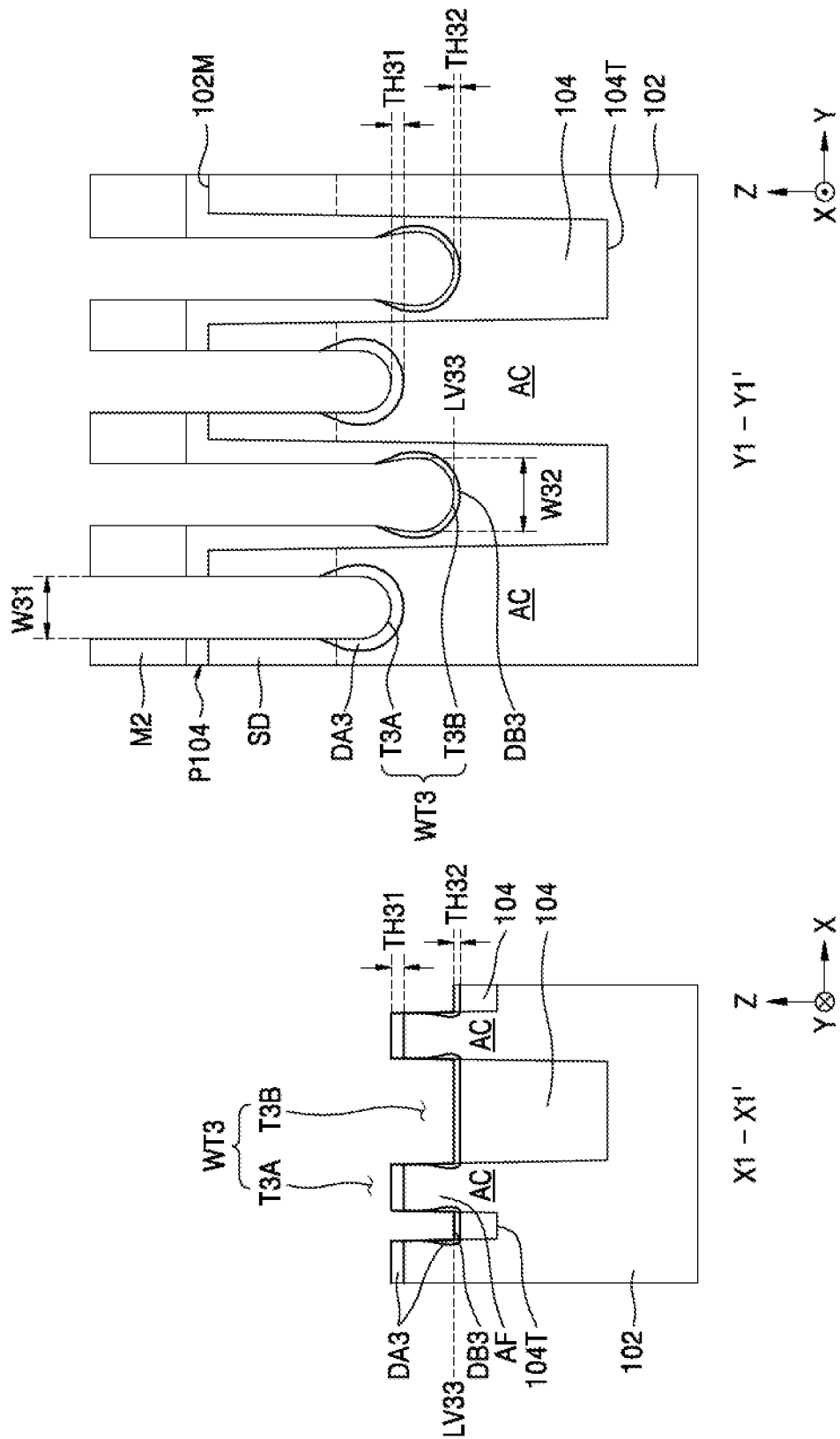
Figure 7C:
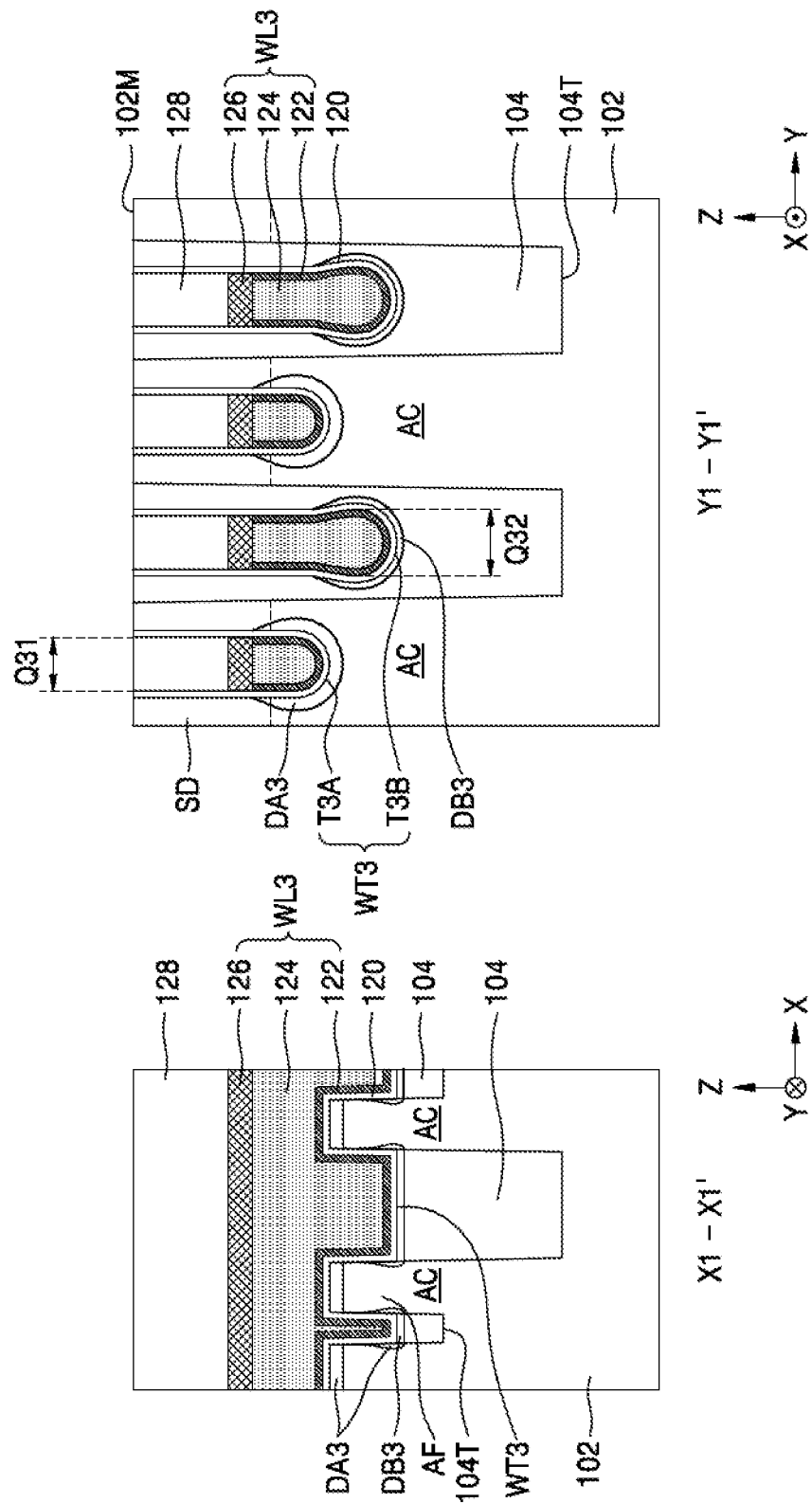

FIGS. 7A to 7C illustrate cross-sectional views illustrating sequential processes of a method of manufacturing an integrated circuit device, according to an exemplary embodiment of the present inventive concept. An example method of manufacturing the integrated circuit device 300 shown in FIGS. 4A and 4B will be described with reference to FIGS. 7A to 7C. FIGS. 7A to 7C each illustrate cross-sectional configurations corresponding to the cross-section taken along line X1-X1' of FIG. 1 and the cross-section taken along line Y1-Y1' of FIG. 1, according to a process sequence.

Referring to FIG. 7A, after processes are performed up to a process of forming the plurality of word line trenches WT in a manner the same as that described with reference to FIGS. 6A to 6C, dopant ions 308 are implanted into the substrate 102 and the device isolation film 104 in a manner similar to that described with reference to FIG. 6D, whereby the first impurity region DA3 is formed in the substrate 102 to surround the first trench portion T1A and the second impurity region DB3 is formed in the device isolation film 104 to surround the second trench portion T1B. The dopant ions 308 may have a configuration the same as that described regarding the dopant ions 108 with reference to FIG. 6D. However, in implanting the dopant ions 308 into the substrate 102 and the device isolation film 104, an implantation angle of the dopant ions 308 may be about 0 degrees relative to the normal direction to the main surface 102M of the substrate 102. Thus, the first impurity region DA3 and the second impurity region DB3 may not be formed in regions adjacent to the main surface 102M of the substrate 102 and in regions adjacent to the top surface of the device isolation film 104, respectively. In an exemplary embodiment of the present inventive concept, to form the first impurity region DA3 and the second impurity region DB3, heat treatment may be performed after the dopant ions 308 are implanted into the substrate 102 and the device isolation film 104. In an exemplary embodiment of the present inventive concept, directly after the dopant ions 308 are implanted into the substrate 102 and the device isolation film 104, a heat treatment process for diffusing the dopant ions 308 may be omitted and a subsequent process may be performed.

Referring to FIG. 7B, unintended native oxide films and contaminants are removed from a result product of FIG. 7A by cleaning the result product of FIG. 7A in a manner the same as that described with reference to FIG. 6E, and the second impurity region DB3 exposed at the inner wall of the second trench portion T1B is partially removed, thereby modifying the plurality of word line trenches WT into the plurality of word line trenches WT3. Each of the plurality of word line trenches WT3 may include the first trench portion T3A in the substrate 102 and the second trench portion T3B in the device isolation film 104.

The first trench portion T3A may have a shape approximately identical or similar to that of the first trench portion T1A (see FIG. 7A). Because the second impurity region DB3 exposed by the second trench portion T1B (see FIG. 7A) has a damaged lattice structure, the second impurity region DB3 may be partially removed during the cleaning of the result product of FIG. 7A and thus have a reduced thickness. For example, reducing the thickness of the second impurity region DB3 exposed by the second trench portion T1B may be performed in a wet etching atmosphere having DHF and $O_3$ etchants. Thus, the width and depth of the second trench portion T1B (see FIG. 7A) increase in a lower portion thereof, whereby the second trench portion T3B, in which a lower width thereof is greater than an upper width thereof in the second horizontal direction (Y direction), may be obtained. A lower width W32 of the second trench portion T3B may be greater than a width W31 of the first trench portion T3A in the second horizontal direction (Y direction), and a level of a lowest surface of the second trench portion T3B may be a third level LV33 that is lower than the second level LV2 (FIG. 7A). After the cleaning process described with reference to FIG. 7B, the second thickness TH32 of the second impurity region DB3 may be smaller than the first thickness TH31 of the first impurity region DA3. The first thickness TH31 of the first impurity region DA3 may be approximately equal or similar to the thickness thereof before the cleaning process described with reference to FIG. 7B.

Referring to FIG. 7C, by performing the processes described with reference to FIGS. 6F to 6H on a result product of FIG. 7B, the gate dielectric film 120, the plurality of word lines WL3, and the buried insulating film 128 may be formed, with each of the plurality of word lines WL3 being arranged on the gate dielectric film 120 to partially fill each of the first trench portion T3A and the second trench portion T3B. The buried insulating film 128 may be formed on each of the plurality of word lines WL3 to fill the remaining space of the first trench portion T3A and the second trench portion T3B. The portion of each of the plurality of word lines WL3, which fills the first trench portion T3A, may have a first width Q31, and the portion of each of the plurality of word lines WL3, which fills the lower portion of the second trench portion T3B, may have a second width Q32 that is greater than the first width Q31 set forth above.

Next, the buffer insulating film 130, the plurality of direct contacts DC, the plurality of bit lines BL, the plurality of insulating spacers 146, the plurality of insulating fences 142, the plurality of conductive plugs 140P, the metal silicide film 172, the conductive landing pad LP, and the insulating film 180 may be formed on or over the substrate 102, thereby manufacturing the integrated circuit device 300, which has the configuration shown in FIGS. 4A and 4B.

Figure 8:
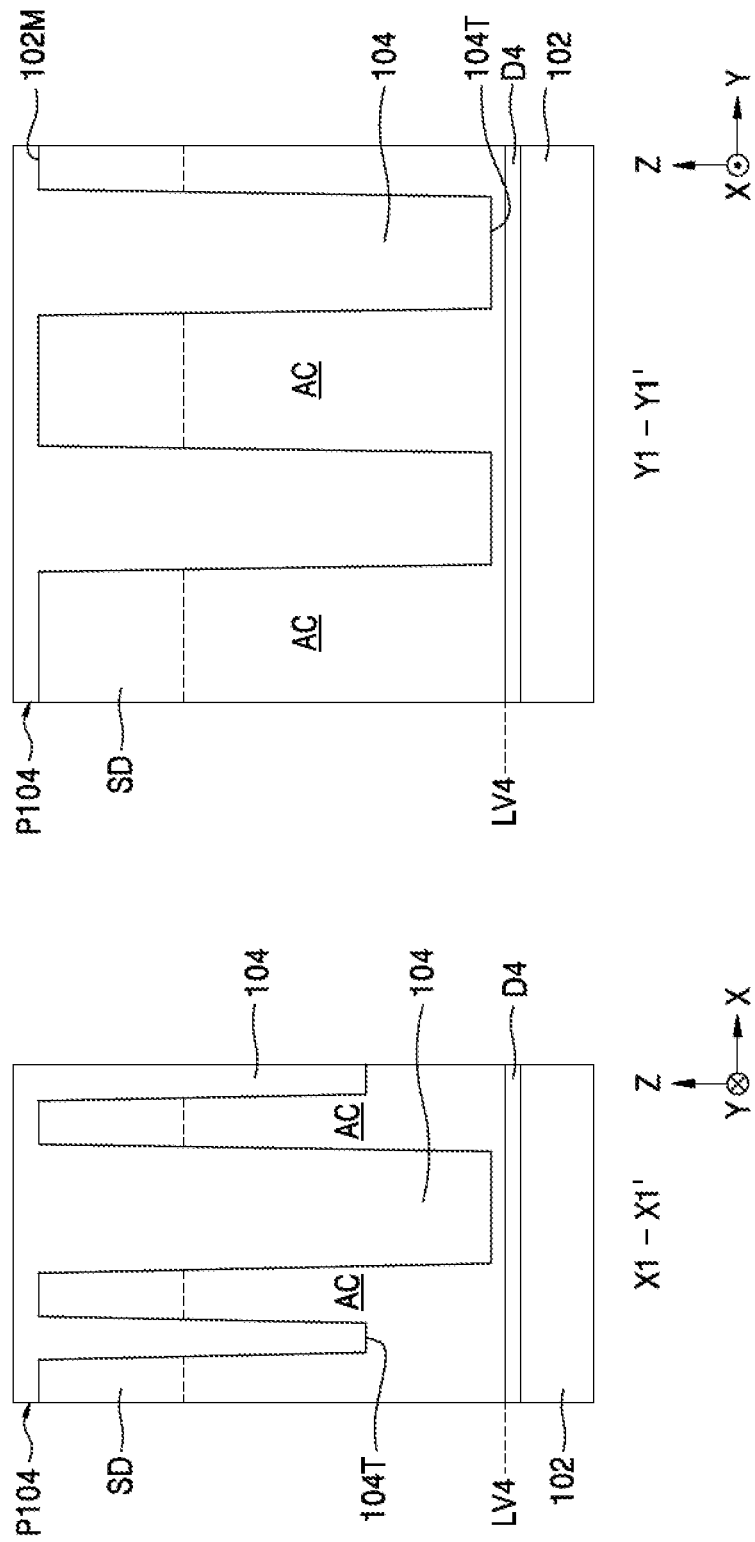
FIG. 8 illustrates cross-sectional views illustrating a method of manufacturing an integrated circuit device, according to an exemplary embodiment of the present inventive concept.

FIG. 8 illustrates cross-sectional views illustrating a method of manufacturing an integrated circuit device, according to an exemplary embodiment of the present inventive concept. An example method of manufacturing the integrated circuit device 400 shown in FIGS. 5A and 5B will be described with reference to FIG. 8. FIG. 8 illustrates cross-sectional configurations corresponding to the cross-section taken along line X1-X1' of FIG. 1 and the cross-section taken along line Y1-Y1' of FIG. 1.

Referring to FIG. 8, by performing the processes described with reference to FIGS. 6A and 6B, the device isolation film 104, which fills the device isolation trench 104T of the substrate 102, and the plurality of source/drain regions SD are formed. However, in the present example, before the plurality of source/drain regions SD are formed, or after the plurality of source/drain regions SD are formed, the impurity region D4 is formed in a flat plate shape in the substrate 102 to extend parallel to the main surface 102M of the substrate 102. Next, the processes described with reference to FIGS. 6C to 6H may be performed, and then, the buffer insulating film 130, the plurality of direct contacts DC, the plurality of bit lines BL, the plurality of insulating spacers 146, the plurality of insulating fences 142, the plurality of conductive plugs 140P, the metal silicide film 172, the conductive landing pad LP, and the insulating film 180 may be formed on or over the substrate 102, thereby manufacturing the integrated circuit device 400 shown in FIGS. 5A and 5B.

Figure 9:
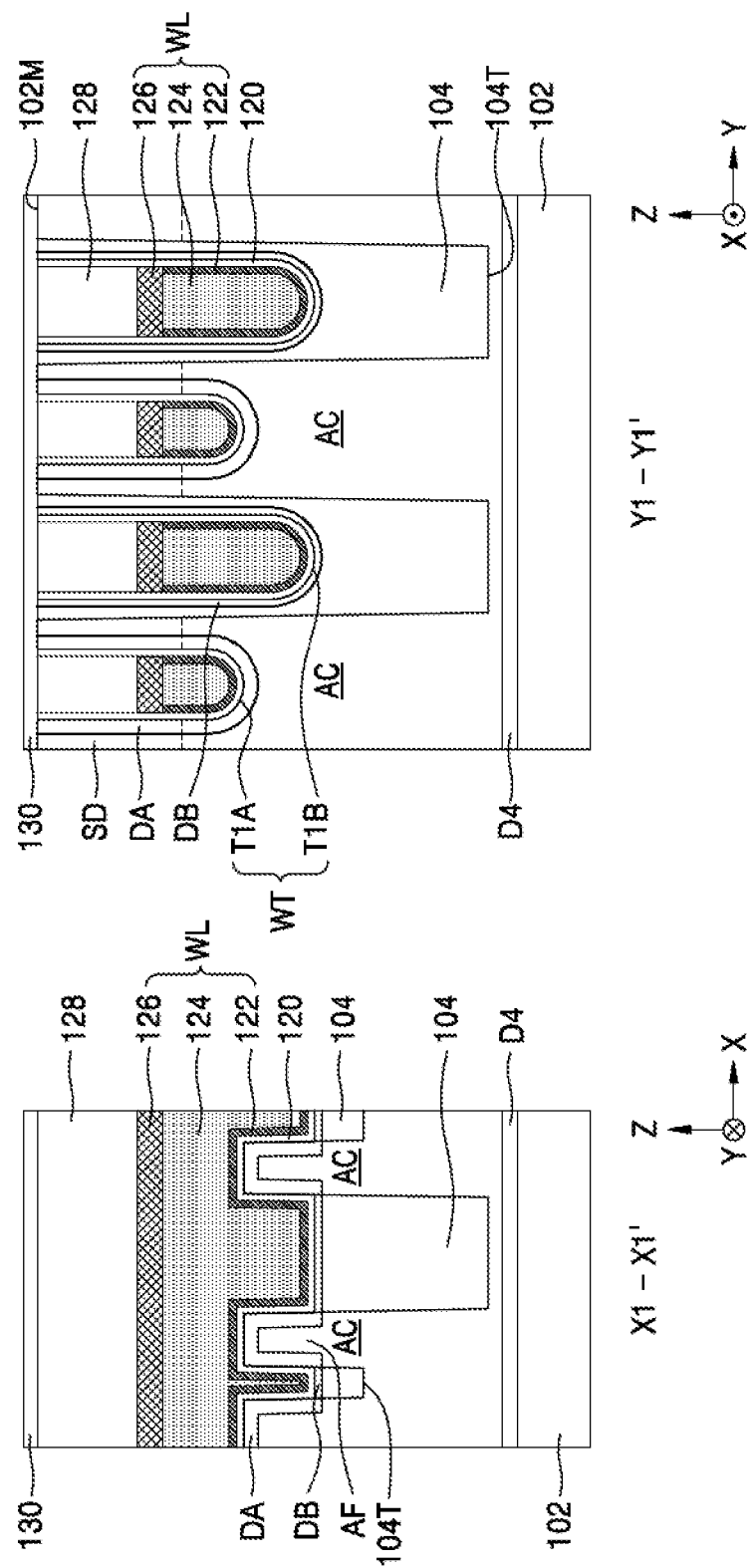
FIG. 9 illustrates cross-sectional views illustrating a method of manufacturing an integrated circuit device, according to an exemplary embodiment of the present inventive concept.

FIG. 9 illustrates cross-sectional views illustrating a method of manufacturing an integrated circuit device, according to an exemplary embodiment of the present inventive concept. Another example method of manufacturing the integrated circuit device 400 shown in FIGS. 5A and 5B will be described with reference to FIG. 9. FIG. 9 illustrates cross-sectional configurations corresponding to the cross-section taken along line X1-X1' of FIG. 1 and the cross-section taken along line Y1-Y1' of FIG. 1.

Referring to FIG. 9, after processes are performed up to a process of forming the plurality of word lines WL and the buried insulating film 128 in a manner the same as that described with reference to FIGS. 6A to 6H, the buffer insulating film 130 is formed on a result product of FIG. 6H. However, in the present example, before the buffer insulating film 130 is formed, or after the buffer insulating film 130 is formed, the impurity region D4 is formed in a flat plate shape in the substrate 102 to extend parallel to the main surface 102M of the substrate 102. Next, the plurality of direct contacts DC, the plurality of bit lines BL, the plurality of insulating spacers 146, the plurality of insulating fences 142, the plurality of conductive plugs 140P, the metal silicide film 172, the conductive landing pad LP, and the insulating film 180 may be formed on or over the buffer insulating film 130, thereby manufacturing the integrated circuit device 400 shown in FIGS. 5A and 5B.

In the processes described with reference to FIGS. 8 and 9, to form the impurity region D4, the implantation process of the dopant ions 108, which is described with reference to FIG. 6D, the implantation process of the dopant ions 308, which is described with reference to FIG. 7A, or an implantation process of dopant ions, which is similar thereto, may be performed. Although FIGS. 8 and 9 illustrate examples in which the impurity region D4 is formed in a flat plate shape to extend at the level LV4 lower than the level of the lowest surface of the device isolation film 104, the present inventive concept is not limited thereto. For example, the impurity region D4 may be formed in a flat plate shape across the substrate 102 and the device isolation film 104 to extend parallel to the main surface 102M of the substrate 102, at a level that is lower than the level of the lowest surface of the word line trench WT and higher than the level of the lowest surface of the device isolation film 104.

Heretofore, although example methods of manufacturing the integrated circuit devices 100, 200, 300, and 400 shown in FIGS. 1 to 5B have been described with reference to FIGS. 6A to 9, it will be understood by those skilled in the art that integrated circuit devices having variously changed and modified structures may be manufactured by making various changes and modifications to the descriptions made with reference to FIGS. 6A to 9 without departing from the scope of the present inventive concept.

While the present inventive concept has been particularly shown and described with reference to specific exemplary embodiments thereof, it will be understood that various changes in form and details may be made therein without departing from the spirit and scope of the present inventive concept as defined by the appended claims.

What is claimed is:

1. An integrated circuit device comprising:
a substrate comprising a plurality of active regions spaced apart from each other;
a device isolation film arranged on the substrate and surrounding the plurality of active regions;
a word line arranged over the plurality of active regions and the device isolation film and extending lengthwise in a first horizontal direction;
a gate dielectric film arranged between the substrate and the word line and between the device isolation film and the word line;
a first impurity region arranged between the substrate and the gate dielectric film; and
a second impurity region arranged between the device isolation film and the gate dielectric film,
wherein a maximum width of a second portion of the word line is greater than a maximum width of a first portion of the word line in a second horizontal direction that is orthogonal to the first horizontal direction, with each of the first portion and the second portion including an entire vertical thickness of the word line, the first portion being arranged over the plurality of active regions, and the second portion being arranged over the device isolation film, and
wherein a thickness of the second impurity region is smaller than a thickness of the first impurity region.

2. The integrated circuit device of claim 1,
wherein the first impurity region comprises an amorphous semiconductor layer comprising dopant ions selected from oxygen (O) ions, silicon (Si) ions, helium (He) ions, argon (Ar) ions, fluorine (F) ions, and combinations thereof.

3. The integrated circuit device of claim 1,
wherein the second impurity region comprises an insulating film comprising dopant ions selected from oxygen (O) ions, silicon (Si) ions, helium (He) ions, argon (Ar) ions, fluorine (F) ions, and combinations thereof.

4. The integrated circuit device of claim 1,
wherein the second impurity region comprises an oxygen-rich silicon oxide film, a silicon oxynitride film, a silicon-rich silicon oxide film, a silicon-rich silicon nitride film, or a combination thereof.

5. The integrated circuit device of claim 1,
wherein each of the first impurity region and the second impurity region comprises interstitial oxygen.

6. An integrated circuit device comprising:
a substrate comprising a device isolation trench, which defines a plurality of active regions apart from each other;
a device isolation film formed in the device isolation trench;
a word line trench extending lengthwise in a first horizontal direction across the plurality of active regions and the device isolation film;
a gate dielectric film covering an inner wall of the word line trench;
a word line arranged on the gate dielectric film and partially filling the word line trench;

a first impurity region arranged between the substrate and the gate dielectric film and contacting the gate dielectric film; and a second impurity region arranged between the device isolation film and the gate dielectric film and contacting the gate dielectric film, wherein a maximum width of a second portion of the word line is greater than a maximum width of a first portion of the word line in a second horizontal direction that is orthogonal to the first horizontal direction, with each of the first portion and the second portion including an entire vertical thickness of the word line, the first portion being arranged over the plurality of active regions, and the second portion being arranged over the device isolation film, and wherein a thickness of the second impurity region is smaller than a thickness of the first impurity region.

7. The integrated circuit device of claim 6, wherein
the first impurity region extends outside the word line trench and along the inner wall of the word line trench, and
the first impurity region comprises dopant ions selected from oxygen (O) ions, silicon (Si) ions, helium (He) ions, argon (Ar) ions, fluorine (F) ions, and combinations thereof.

8. The integrated circuit device of claim 6, wherein
the second impurity region extends outside the word line trench and along the inner wall of the word line trench, and
the second impurity region comprises dopant ions selected from oxygen (O) ions, silicon (Si) ions, helium (He) ions, argon (Ar) ions, fluorine (F) ions, and combinations thereof.

9. The integrated circuit device of claim 6, wherein
the gate dielectric film comprises an oxygen-rich oxide film.

10. The integrated circuit device of claim 6,
wherein the first impurity region and the second impurity region each comprises interstitial oxygen.

11. The integrated circuit device of claim 6,
wherein each of the first impurity region and the second impurity region comprises interstitial atoms comprising dopant ions selected from oxygen (O) ions, silicon (Si) ions, helium (He) ions, argon (Ar) ions, fluorine (F) ions, and combinations thereof.

12. The integrated circuit device of claim 6,
wherein the second impurity region comprises an oxygen-rich silicon oxide film, a silicon oxynitride film, or a combination thereof.

13. The integrated circuit device of claim 6, wherein
the first impurity region extends outside the word line trench and along a portion of the inner wall of the word line trench and is apart from a main surface of the substrate; and the second impurity region extends outside the word line trench and along an other portion of the inner wall of the word line trench and is apart from the top surface of the device isolation film.

14. The integrated circuit device of claim 6, further comprising:
an impurity region arranged in a flat plate shape in the substrate and extending parallel to a main surface of the substrate,
wherein the impurity region comprises interstitial atoms comprising oxygen (O) atoms, silicon (Si) atoms, helium (He) atoms, argon (Ar) atoms, fluorine (F) atoms, or a combination thereof.

15. An integrated circuit device comprising:
a substrate comprising a plurality of active regions spaced apart from each other;
a device isolation film arranged on the substrate and surrounding the plurality of active regions;
a word line arranged over the plurality of active regions and the device isolation film and extending lengthwise in a first horizontal direction;
a gate dielectric film arranged between the substrate and the word line and between the device isolation film and the word line; and
an impurity region arranged on the substrate and the device isolation film and contacting the gate dielectric film,
wherein a maximum width of a second portion of the word line is greater than a maximum width of a first portion of the word line in a second horizontal direction that is orthogonal to the first horizontal direction, with each of the first portion and the second portion including an entire vertical thickness of the word line, the first portion being arranged over the plurality of active regions, and the second portion being arranged over the device isolation film, and
wherein the impurity region comprises a first impurity region contacting the substrate and a second impurity region contacting the device isolation film, and a thickness of the second impurity region is smaller than a thickness of the first impurity region.

16. The integrated circuit device of claim 15, wherein
the impurity region comprises dopant ions selected from oxygen (O) ions, silicon (Si) ions, helium (He) ions, argon (Ar) ions, fluorine (F) ions, and combinations thereof.

17. The integrated circuit device of claim 15, wherein
a lower width of the second portion of the word line is greater than an upper width thereof in the second horizontal direction.

* * * * *